United States Patent [19]
Faur et al.

[11] Patent Number: 6,080,683
[45] Date of Patent: Jun. 27, 2000

[54] ROOM TEMPERATURE WET CHEMICAL GROWTH PROCESS OF SIO BASED OXIDES ON SILICON

[75] Inventors: Maria Faur; Mircea Faur, both of North Olmsted; Dennis J. Flood, Oberlin; Sheila G. Bailey, Lakewood; Horia M. Faur, North Olmsted, all of Ohio

[73] Assignee: Special Materials Research and Technology, Inc., North Olmsted, Ohio

[21] Appl. No.: 09/273,373

[22] Filed: Mar. 22, 1999

[51] Int. Cl.[7] .................................................. H01L 21/31
[52] U.S. Cl. ........................ 438/770; 438/769; 438/787; 438/789; 438/790; 427/443.2; 427/435
[58] Field of Search ..................................... 438/769, 770, 438/787, 789, 790; 427/443.2, 435, 397.7, 169

[56] References Cited

U.S. PATENT DOCUMENTS

| | | | |
|---|---|---|---|
| 2,505,629 | 4/1950 | Thomsen et al. | 117/124 |
| 4,347,097 | 8/1982 | Nishizawa | 156/622 |
| 4,431,683 | 2/1984 | Sasaki et al. | 427/39 |
| 4,468,420 | 8/1984 | Kawahara et al. | 427/397.7 |
| 4,693,916 | 9/1987 | Nagayama et al. | 427/397.7 |
| 5,073,408 | 12/1991 | Goda et al. | 427/169 |
| 5,132,140 | 7/1992 | Goda et al. | 427/169 |
| 5,429,995 | 7/1995 | Nishiyama et al. | 437/238 |
| 5,492,859 | 2/1996 | Sakaguchi et al. | 437/86 |
| 5,506,006 | 4/1996 | Chou et al. | 427/430.1 |
| 5,536,361 | 7/1996 | Kondo et al. | 156/630.1 |
| 5,616,233 | 4/1997 | Jenn-Gwo et al. | 205/157 |
| 5,646,440 | 7/1997 | Hasegawa | 257/635 |
| 5,648,128 | 7/1997 | Yah et al. | 427/601 |
| 5,659,192 | 8/1997 | Sarama et al. | 257/347 |
| 5,661,092 | 8/1997 | Koberstein et al. | 427/515 |
| 5,674,356 | 10/1997 | Nagayama | 156/659.11 |
| 5,703,404 | 12/1997 | Matsuura | 257/758 |

OTHER PUBLICATIONS

"A New Process for Silica Coating", Hirotsugu Nagayama, Hisao Honda, and Hideo Kawahara, J. Electrochem. Soc.: Solid–State Science and Technology, Aug. 1988, pp. 2013–2016.

"A Selective $SiO_2$ Film–Formation Technology Using Liquid–Phase Deposition for Fully Planarized Multilevel Interconnections", Tetsuya Homma, Takuya Katoh, Yoshiaki Yamada, and Yukinobu Murao, J. Electrochecm. Soc., vol. 140, No. 8, Aug. 1993, pp. 2410–2414.

"The Initial Growth Mechanism of Silicon Oxide by Liquid–Phase Deposition", Jenq–Shiuh Chou and Si–Chen Lee, J. Electrochem. Soc., vol. 141, No. 11, Nov. 1994, pp. 3214–3218.

"The Physicochemical Properties and Growth Mechanism of Oxide ($SiO_{2-x}F_x$) by Liquid Phase Deposition with $H_2O$ Addition Only", Ching–Fa Yeh, Chun–Lin Chen, and Guan–Hong Lin, J. Electrochem. Soc., vol. 141, No. 11, Nov. 1994, pp. 3177–3181.

"Low–Temperature Processed MOSFET's with Liquid Phase Deposited $SiO_{2-x}F_x$ as Gate Insulator", Ching–Fa Yeh, Shyue–Shyh Lin, and Tzy–Yan Hong, IEEE Electron Device Letters, vol. 16, No. 7, Jul. 1995, pp. 316–318.

"Photoassisted Liquid–Phase Deposition of Silicon Dioxide", Chen–Tang Huang, Peng–Heng Chang, and Jin–Shown Shie, J. Electrochem. Soc., vol. 143, No. 6, Jun. 1996, pp. 2044–2048.

*Primary Examiner*—John F. Niebling
*Assistant Examiner*—Alexander G. Ghyka
*Attorney, Agent, or Firm*—Pearne & Gordon LLP

[57] ABSTRACT

Disclosed is a room temperature wet chemical growth (RTWCG) process of SiO-based insulator coatings on silicon substrates for electronic and photonic (optoelectronic) device applications. The process includes soaking the Si substrates into the growth solution. The process utilizes a mixture of $H_2SiF_6$, N-n-butylpyridinium chloride, redox $Fe^{2+}/Fe^{3+}$ aqueous solutions, and a homogeneous catalyst.

21 Claims, 11 Drawing Sheets

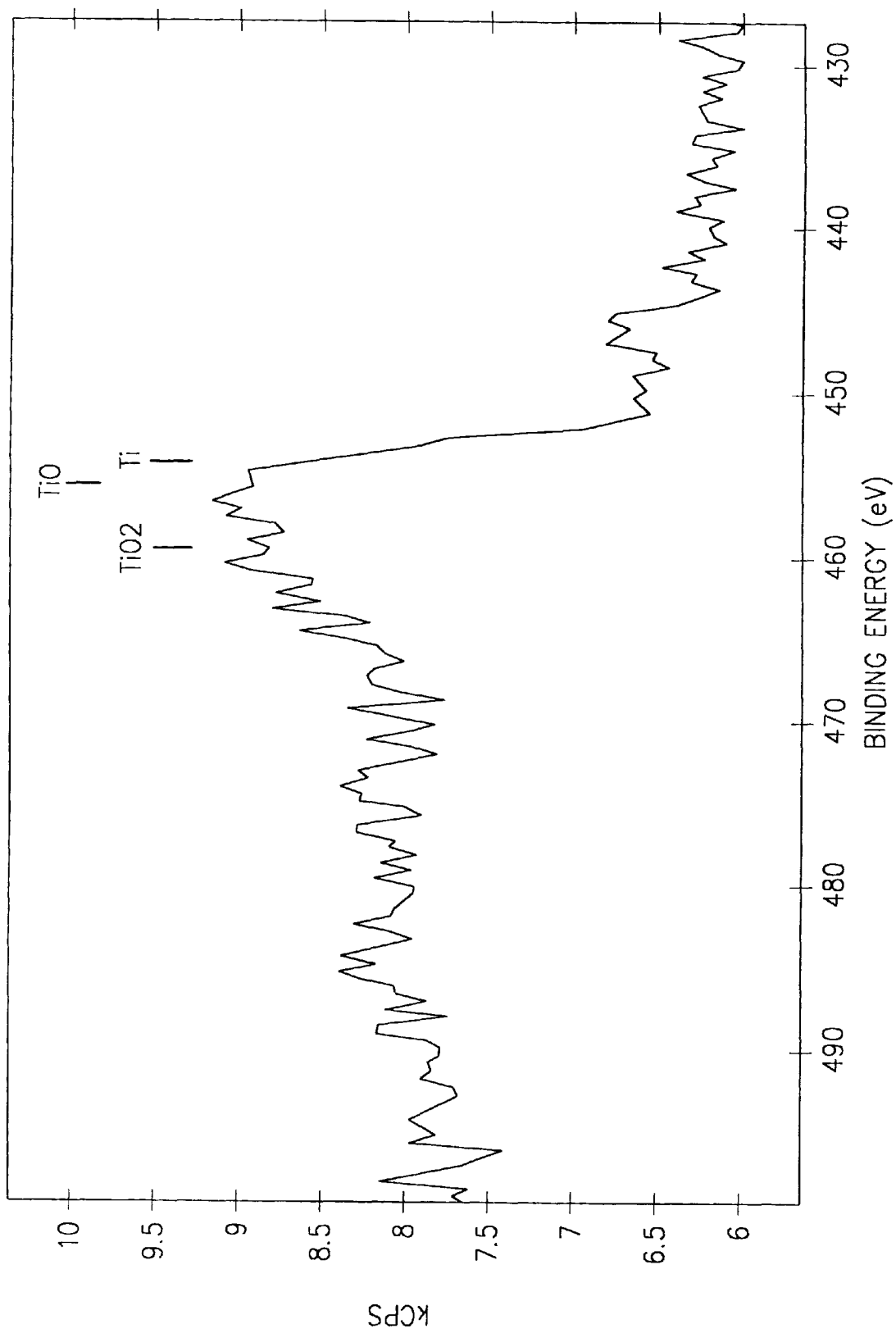

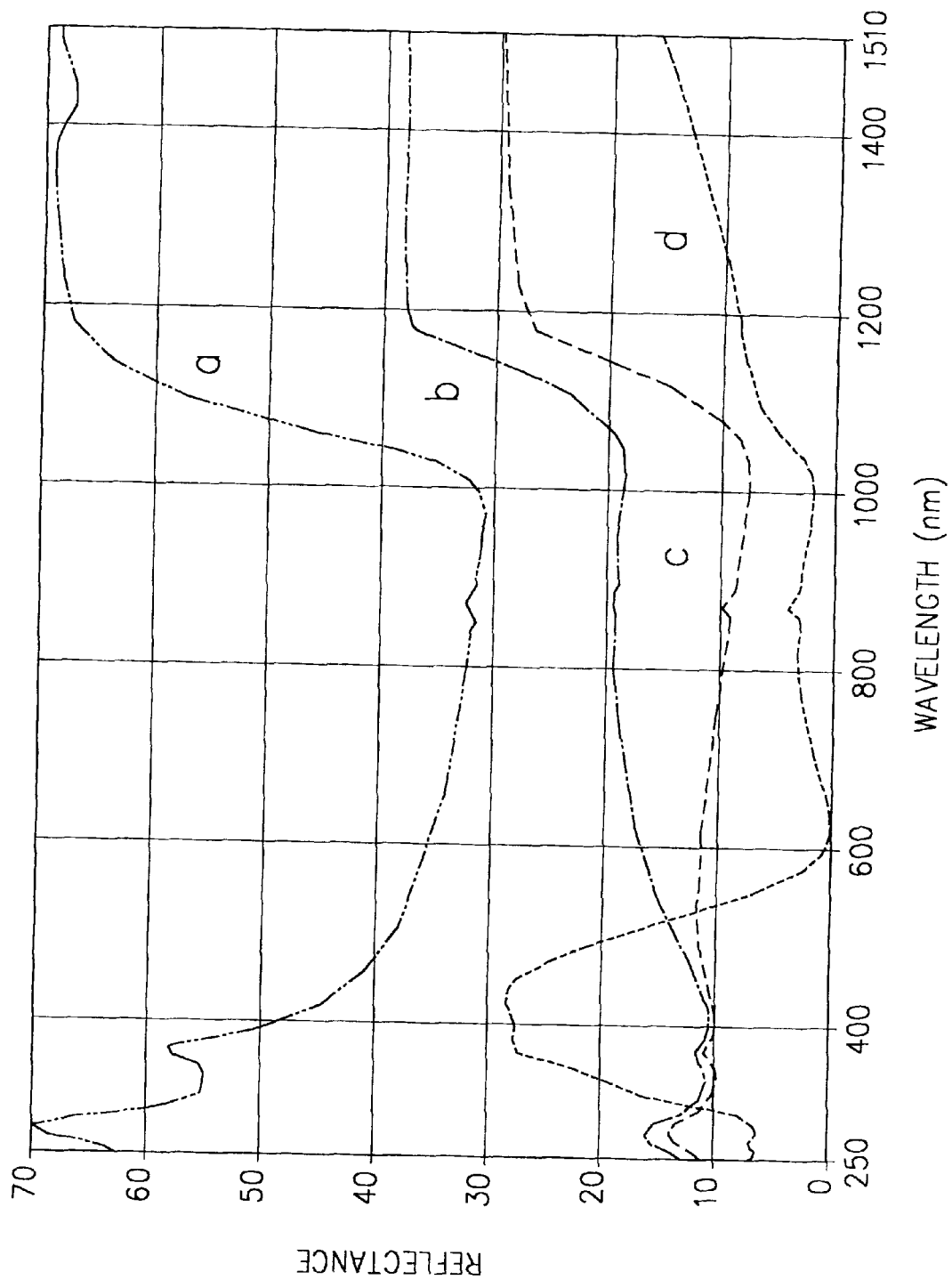

ROOM TEMPERATURE WET CHEMICAL GROWTH PROCESS OF SIO BASED OXIDES ON SILICON

BACKGROUND OF THE INVENTION

This invention relates to a room temperature wet chemical growth (RTWCG) process of SiO-based insulator coatings on semiconductor substrates including Si, Ge, III–V and I–III–VI compound semiconductors and, specifically, to the RTWCG of SiO-based films on Si in the manufacture of silicon-based electronic and photonic (optoelectronic) device applications.

The United States Government has rights in this invention pursuant to NASA Contract No. NAS3-97181.

Silicon dioxide ($SiO_2$) forms the basis of the planar technology. In industrial practice insulator coatings for electronic and photonic devices layers are most frequently formed by thermal oxidation of Silicon (Si) in the temperature range 900 to 1200° C. $SiO_2$ is also deposited by chemical vapor deposition (CVD) techniques at lower temperatures (200 to 900° C.) on various substrates.

Thermal and CVD-grown $SiO_2$ based layers are used as diffusion masks, to passivate device junctions, as electric insulation, as dielectric material in Si technology, and as capping layers for implantation-activation annealing in III–V compound semiconductor technology, to name a few.

The growth of insulator films at low temperatures is very attractive for most device applications due to reduced capital cost, and high output and technological constraints associated with the growth of dielectric thin films using conventional high-temperature growth/deposition techniques.

Dielectric films for photonic devices are well known in the art and are usually deposited at near room temperature on various substrates using physical vapor deposition processes including conventional (nonreactive) or reactive resistive, induction or electron beam evaporation, reactive or nonreactive dc or RF magnetron and ion-beam sputtering processes.

Room temperature growth of insulator layers on semiconductor surfaces using anodic oxidation is known in the art. For silicon, using anodic oxidation up to 200 nm $SiO_2$ layers can be grown on the underlying Si substrates. The anodic oxidation process consumes about 0.43 of the thickness of the oxide from the underlying Si substrate, and is not compatible with most metallization schemes. This limits its application as a replacement of thermal or vacuum deposited $SiO_2$.

Deposition of SiO2 insulator layers from solutions is known in the art using organo-metallic solutions. In this procedure, the insulator layer is applied onto the substrate either by dipping the substrate into the solution or by spinning the substrate after a small amount of the solution is applied onto the surface. In both cases the substrate is then placed in an oven to drive off the solvent.

Researchers from Japan, China and Taiwan describe processes for deposition of $SiO_2$ and $SiO_{2-x}F_x$ layers on glass and silicon surfaces using a room temperature (30 to 50° C.) solution growth. The growth of liquid-phase deposited (LPD) $SiO_2$, initially proposed by Thomsen et al. for deposition of $SiO_2$ on the surface of soda lime silicate glass, is based on the chemical reaction of $H_2SiF_6$ with water to form hydrofluoric acid and solid $SiO_2$. The initial $H_2SiF_6$ solution is saturated with $SiO_2$ powder (usually in a sol-gel form). Before immersing the glass into the solution, a reagent that reacts with the hydrofluorosilicilic acid, such as boric acid, was added to the solution. Boric acid reacts with the hydrofluorosilicilic acid and makes the solution supersaturated with silica.

One of the major disadvantages of $SiO_2$ LPD method described above is a very low deposition rate of about 8 nm/hour to about 24 nm/hour, which makes it impractical for growing insulator layers for most semiconductor device applications. Deposition rates of up to 110 nm/hour are claimed by Ching-Fa Yeh et al. in the hydrofluorosilicilic acid-water system and the composition of the resulting films was reported to be $SiO_{2-x}F_x$ where x is about 2%. our own experimentation using the LPD method, seems to indicate that the LPD $SiO_2$ has poor adhesion to the Si surfaces, and the maximum growth rate we obtained is smaller than the reported values (less than 25 nm/hour). Even assuming that the reported 110 nm/hour deposition rates are possible, these deposition rates are still too low since assuming that the deposition rate is constant with the deposition time, it will require about 9 hours to deposit an oxide with a thickness of about 1 μm needed for ULSI interlevel dielectric.

The term RTWCG process of SiO-based insulator layers as used herein means a room temperature (e.g., 10° C.–40° C.) wet chemical growth process of $Si_xO_yX_z$ (SiOX) layers where x is from 0.9 to 1.1, y is from 0.9 to 1.9 and z is from 0.01 to 0.2, where Si stands for silicon, O stands for oxygen, and X is either fluorine (F), carbon (C) or a combination of these with iron (Fe), palladium (Pd), or titanium (Ti) contaminants, depending on the redox system being used.

SUMMARY OF THE INVENTION

This invention relates to a room temperature wet chemical growth (RTWCG) process of silicon oxide (SiO) based thin film dielectrics on semiconductor substrates and, specifically, to the RTWCG of SiO-based films on silicon in the manufacture of silicon-based electronic and photonic (optoelectronic) device applications.

It is an object of the invention to provide a silicon oxide-based film using a room temperature wet chemical growth (RTWCG) process for electronic and photonic (optoelectronic) device applications that is compatible with device fabrication steps, has large growth rates, low stress, good adhesion to silicon and silicon oxide coated surfaces, is stable on long term air exposure, and high temperature annealing, and that has very good conformity.

It is a further object to provide a silicon oxide-based RTWCG process of low dielectric constant SiO based films for use as intermetallic dielectric (IMD) and interlevel dielectric (ILD) in ultra large scale integrated (ULSI) silicon based microelectronics.

It is a further object to provide an ultra thin film silicon oxide-based RTWCG process to be used as gate dielectric for ULSI silicon based microelectronics.

It is a further object to provide a silicon oxide-based RTWCG process of thin film insulators to be used as passivation layers for photonic (optoelectronic) device applications.

It is a further object to provide a silicon oxide-based RTWCG process to grow passivating/antireflection coatings, after the front grid metallization for the fabrication of low cost silicon solar cells and for other photonic (optoelectronic) device applications.

It is a further object to provide a silicon oxide-based RTWCG deposition process to be used as passivating films for porous silicon coated photonic (optoelectronic) devices.

High growth rates of SiOX oxides according to this invention are grown on planar or porous silicon using commercial grade $H_2SiF_6$ (34%) as silicon source, N-n-butylpyridinium chloride ($C_9H_{14}ClN$) and redox aqueous solutions based on $Fe^{2+}/Fe^{3+}$, e.g., $K_3Fe(CN)_6$, and Iron Ethylenediaminetetraacetic acid (Fe EDTA). For convenience the above class of solutions we are going to call the basic growth solution. The basic solution (BS) can be saturated with $SiO_2$-containing sources such as silica gel. Catalysts such as palladium II trifluoroacetate [$Pd(O_2C_2F_3)_2$] (PdFAc) and $H_2TiF_6$ aqueous solutions are used to increase the growth rate. NaOH, KOH, NaF and $NH_4F$ and HF solutions are used according to this invention to adjust the pH of the growth solution. The RTWCG rate on Si surfaces is from 2 nm/minute to 64 nm/minute, depending on the composition of the solution, pH, and crystallographic orientation of the Si substrates. The chemical composition of the grown layer has the general formula:

$$Si_xO_yX_z,$$

where the significance of Si, O, X, and x, y and z are as explained above.

BRIEF DESCRIPTION OF THE DRAWINGS

The foregoing and other objects, features and advantages of the invention will be apparent from the following more particular description of preferred embodiments of the invention, as illustrated in the accompanying drawings.

FIG. 7a and FIG. 7b are clasp views of Ti and Fe windows in the survey in FIG. 6.

FIG. 10 are plots of reflectivity against wavelength of (a) RCA cleaned (100) p-type Si, (b) PS coated, (c) RTWCG SiOX passivated PS using a solution A4-Pd, (d) RTWCG SiOX oxide using a solution BS-PS6.

DETAILED DESCRIPTION OF THE PREFERRED EMBODIMENTS

Figure 1:
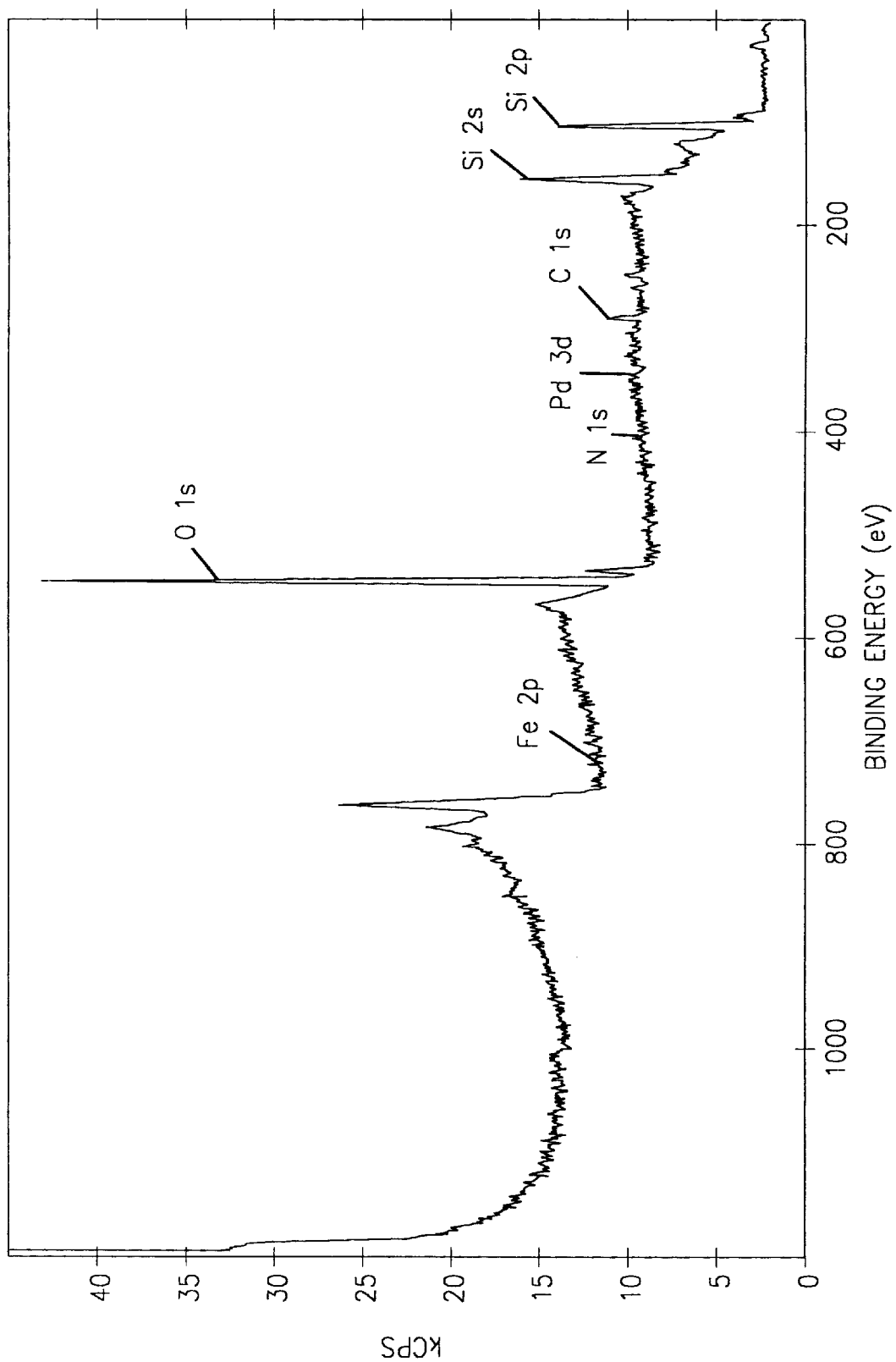
FIG. 1 is a XPS surface survey of an RTWCG SiOX oxide (89 nm thick), grown on (111) p-type Si:B in A4:Pd solution, after sputtering of about 30 nm from the surface.

Surface OH groups are known in the art as one of the most important sites for chemical reactions at oxide surfaces. The OH groups are formed by the chemisorption of water molecules on the oxide surface. The hydration mechanism involves the dissociation of an adsorbed water molecule, where an $H^+$ ion bonds to an oxygen ion on the surface and an $OH^-$ ion bonds to a silicon ion on the surface. The SiOH groups can undergo acid or base reactions. They accept a hydrogen ion to become an $SiOH_2^+$ site having a positive charge, or they release a hydrogen ion to become $SiO^-$ site having a negative charge. The reactions are written as:

$$SiOH+H^+(Aq) \rightarrow SiOH_2^+$$

$$SiOH \rightarrow SiO^- + H^+(Aq)$$

The concentration of the $SiOH_2^+$ and $SiO^-$ species depend on the pH of the aqueous phase. The $SiOH_2^+$ species increases at pH<7, while the $SiO^-$ species increases at pH>7.

After the RCA clean and prior to the final water rinse, the silicon surface is passivated by $\equiv$Si—H and $\equiv$Si—F bonds. We define the "induction time" as the time interval $dt=t_{ox}-t_{in}$, where $t_{ox}$ is the time referenced to the initial time ($t_{in}$) after which the oxide deposition is initiated. For HF treated surfaces we found an induction time from 10 seconds to 2 minutes. On contrary, on similar silicon samples covered either with a thin native oxide (no RCA clean) or thermally grown $SiO_2$ layers, the induction time is from about 10 to 20 seconds.

Prior to the initiation of the RTWCG of SiOX-based layer, for hydrogen- or fluorine-terminated Si surfaces the Si—H and Si—F bonds has to be converted into the Si—OH bonding group.

The hydration mechanism of hydrogen passivated surfaces should follow the reaction:

$$\equiv Si-H+OH^- \rightarrow \equiv Si-O^- + H_2.$$

For $\equiv$Si—F terminated bonds, rinsing the samples in water allows the Si—F→Si—OH to take place according to the reaction:

$$Si-F+H_2O \rightarrow Si-OH+HF$$

From the last two reactions, it is apparent that in the presence of HF, the surface may be subject to HF attack through HF insertion into the Si—O bond, according to the reaction:

$$\equiv Si-O^- + HF \rightarrow \equiv Si-F+OH^-$$

with the subsequent removal of the surface Si atom from the surface of the underlying Si—O oxide.

We found that after the HF dip, rinsing the substrates in deionized water for 5 to 10 minutes or into 0.1% $H_2O_2$ for 1 to 2 minutes, depending on the crystallographic orientation, doping type and majority carrier concentration, the induction time for all silicon substrates was below 20 seconds.

Once the growth of a native oxide layer has began, Si—H and Si—F bonds are replaced by the Si—OH bonds. These Si—OH groups in turn facilitate the incorporation from the growth solution of silicon and oxygen by forming Si—O—Si bond angles. Associated Si—OH groups also act as preferential adsorption sites for water molecules further speeding up oxygen and silicon incorporation process.

In designing the room temperature RTWCG process of SiOX dielectric layers, we imposed the following conditions:

the use of elements, which are known to harm the semiconductor devices, should be avoided; only Si (O, C, H, and N) are acceptable.

for growing SiOX oxides, metal impurities such as Mg, Ti, and Ta, which are known to introduce large density of states at the Si/insulator interface, should be avoided.

the SIOX films should be stable in reducing and oxidizing atmosphere, with respect to factors such as heat, humidity, prolonged exposure to UV light, atomic oxygen and ionizing radiation such as high energy electrons and protons.

the SiOX films should have contamination-free bonding to the Si surfaces and sufficient mechanical strength.

the growth process should be applicable to any Si surface, irrespective of crystal orientation, size and shape.

the growth process should be compatible with processing sequences of advanced Si devices, e.g. VLSI microelectronics with critical features below 0.25 μm.

High deposition rate of SiOX oxides are deposited using commercial grade $H_2SiF_6$ (34%) as silicon source, n-n butyldipyrinium chloride (n-BPCl) and redox $Fe^{2+}/Fe^{3+}$ (10%) such as $K_3Fe(CN)_6$ (KFeCN) and Fe EDTA aqueous solutions. In a preferred embodiment of the invention, the growth solution is made by mixing 2 to 5 volume parts of 34% $H_2SiF_6$ (HSiF) with 2 to 5 volume parts of 0.5 M KFeCN aqueous solution and 0 to 4 volume parts of 5% n-BPCl aqueous solution. This solution, for convenience we are going to call: "the basic solution (BS)." The BS can be saturated with $SiO_2$-containing sources such as silica gel or with $(NH_4)_2SiF_6$. Catalysts such as palladium II trifluoroacetate $Pd(O_2C_2F_3)_2$ (PdFAc) are adequate for mild acidic solutions (pH from 4 to 6). $Ti^{4+}$-based aqueous solutions such as hexafluorotitanate $H_2TiF_6$ (HTiF), titanium chloride $TiCl_4$ (TiCl) and $(NH_4)_2TiF_6$ (NHTiF) we found to be adequate catalysts for the growth in aqueous solutions (pH from 3 to 8), and its use sensitively increases the SiOX RTWCG rate. NaF, KOH, NaF and $NH_4F$ solutions are used according to this invention to adjust the pH of the growth solution between 3 and 10.

The volume of the growth solution is from 0.2 ml to 0.6 ml/1 cm² of the Si surface which comes in contact with the solution (not including the portions of the surface covered by photoresist) for a SIOX oxide thickness of 0.1 to 0.25 μm. For best results, the solution is agitated by any practical means until the solids are completely dissolved, and during the RTWCG so as to ensure uniform coating.

In FIG. 1 is given a XPS surface survey of an RTWCG SiOX oxide, grown on (111) p-type Si:B with $(N_A-N_D)$ of about $2\times10^{19}$ cm⁻³ using the A4:Pd solution, after sputtering of about 30 nm from the surface. The composition of the A4:Pd RTWCG solution is: 5 volume parts of 34% HSiF, 3 volume parts of 5% n-BPCl, 2 volume parts of 30% $HNO_3$ solution, 1 volume part $CH_3COOH$, 0.1 grams of KFeCN and 10 mg of PdFAc.

Prior to the growth, the solution was stirred using an magnetic agitator for 10 minutes. The surface of the Si substrate was cleaned using the standard RCA clean, and rinsed in deionized (DI) water for 10 minutes. After 3 minutes, in the dark, the thickness of the oxide measured by ellipsometry was 89 nm, which corresponds to a growth rate of about 30 nm/min. However, for longer growth times, the growth rate decreases, reaching about 12 nm/min, after 10 minutes growth time. The thickness of the underlying substrate removed during the growth was about 20 nm for the 89 nm thick oxide and of about 32 nm for the 123 nm thick oxide. In both cases this is about 25% of the oxide thickness. This means that the oxide formation process is not a simple chemical oxidation, since in this case the thickness of the removed layer from the Si surface should be at least 43% the thickness of the oxide. The oxide formation in this case is a dual chemical oxidation and growth process.

The RTWCG rates in A4:Pd solutions we found to be highly preferential for silicon wafers with various crystallographic orientation. For example, the growth rate is up to 15 fold higher for (111) Si compared to (100) Si, and up to 4 fold for (110) Si compared to (100) Si. The chemical composition of the above oxides is Si-rich SiOX, as revealed by XPS data. In Table 1 are shown some quantitative XPS data, including the position, normalized areas and the atomic concentration of the main components of the oxide, recorded after sputtering about 30 nm from the surface of the 89 nm thick oxide.

TABLE 1

Quantification Table for Experiment A4:Pd-12. Sputtered 30 nm.

| Peak  | Center (eV) | SF   | Norm. Area | [At] %  |
|-------|-------------|------|------------|---------|
| F 1s  | 686.5       | 1.00 | 4.67676    | 0.401   |
| O 1s  | 532.0       | 0.66 | 507.31055  | 43.463  |
| Pd 3d | 342.5       | 4.60 | 0.61422    | 0.053   |
| C 1s  | 283.5       | 0.25 | 67.43414   | 5.777   |
| Si 2p | 99.5        | 0.27 | 587.19482  | 50.307  |

The oxidation rate in the A4:Pd solution of (111) a n-Si substrate, under the dark is much smaller compared to that of p-Si. Under about 100 mW/cm² visible light, the "growth" rate on n-Si was about the same, compared to the p-Si substrate. For both conductivity type (111) Si substrates, the thickness of the underlying Si substrate removed, is up to 25% of the oxide thickness, which suggests that a chemical oxidation reduction process is responsible for the formation of the chemical oxide. The A4:Pd solution was also tried for growing SiOX layers on (100) and (110) Si substrates. As mentioned above, the growth rates in these cases were much lower than that on (111) Si substrates. Because of this, on (100) Si substrates, the oxide grows preferentially at the defect areas, which reveal the (111) planes. This art-effect can be used for a non-destructive and very precise way to reveal the surface defects type and density on (100) Si surfaces.

Higher RTWCG rates of SiOX dielectric layers are recorded in mild BS based solutions, when pH is kept between 4 and 9. In this case, the difference between the growth rates on various crystallographic orientation, doping type and majority carrier concentration of Si surfaces are relatively small. For similar crystallographic orientations at similar carrier concentrations, in the dark, the growth rate is from 5% to 8% larger for p-type B-doped substrates compared to n-type P-doped substrates. For similar doping type and doping concentrations there exist slight differences in the growth rates on Si substrates of different crystallographic orientations. The growth rate on (111) p-type B-doped Si with $(N_A-N_D)$ of about $2\times10^{19}$ cm⁻³, was found to be from 5 to 7% higher as compared to the growth rate on (100) p-Si of essentially similar carrier concentration.

Figure 2:
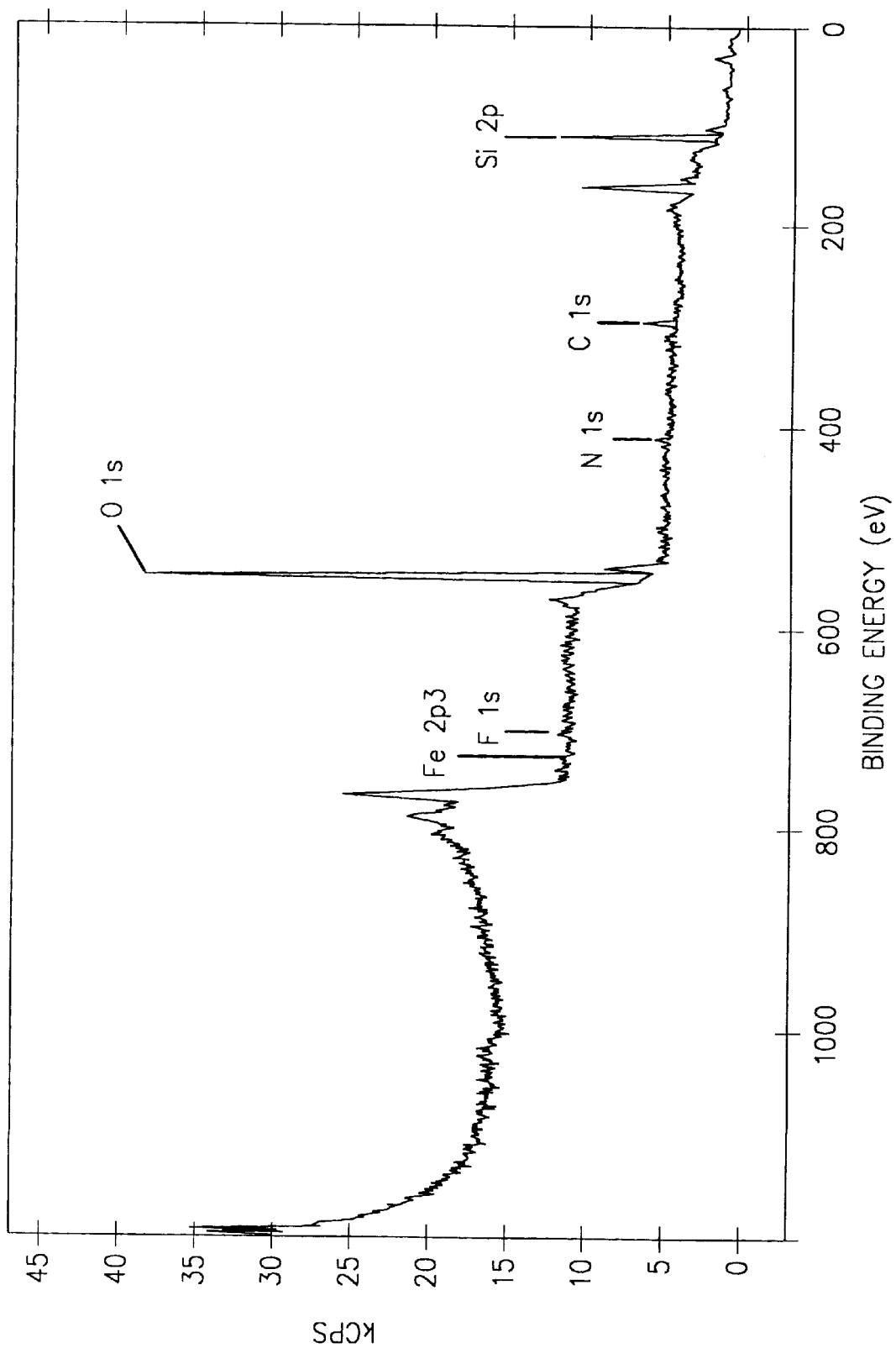
FIG. 2 is a XPS surface survey of an RTWCG SiOX oxide (112 nm thick), grown on p-type Si in BS:B15 solution, after the removal of about 3 nm from the surface.

FIG. 2 is a XPS surface survey of an RTWCG SiO oxide (112 nm thick), grown on p-type Si in BS-B15 solution. The growth solution was made by mixing 2 volume parts of 34% HSiF, 2 volume parts of 5% n-BPCl aqueous solution, 1 volume part 0.5 M KOH aqueous solution, and with 0.3 g M KFeCN/100 ml solution. The growth time was 4 minutes, and the growth rate of 38 nm/min. For an oxide thickness of 235 nm, the growth rate was of about 35 nm/min. Table 2 gives some XPS data recorded at the surface of the oxide in FIG. 2.

TABLE 2

Quantification Table for Experiment BS-B15. Sputtered 30 nm.

| Peak | Center (eV) | SF | Norm. Area | [At] % |
|---|---|---|---|---|
| Fe 2p3 | 707.5 | 10.54 | 2.74384 | 0.063 |
| F 1s | 688.5 | 4.26 | 8.30465 | 0.189 |
| O 1s | 532.5 | 2.85 | 1947.9851 | 44.43 |
| N 1s | 399.0 | 1.77 | 13.91553 | 0.317 |
| K 2s | 373.5 | 1.95 | 0 | 0 |
| C 1s | 284.5 | 1.00 | 126.72832 | 2.89 |
| Si 2p | 102.5 | 0.87 | 2284.70996 | 52.11 |

The oxide above can be ascribed as Si-rich SiOX with C, Fe, N and F contaminants. No K has been detected at the surface. After sputtering 30 nm from the surface of the sample, Fe, C and Si concentrations decreased to 0.038%, 1.93%, and 50.26%, respectively, while the F, N, and 0 concentrations increased to 0.34%, 0.65%, and 46.78%, respectively.

Figure 3:
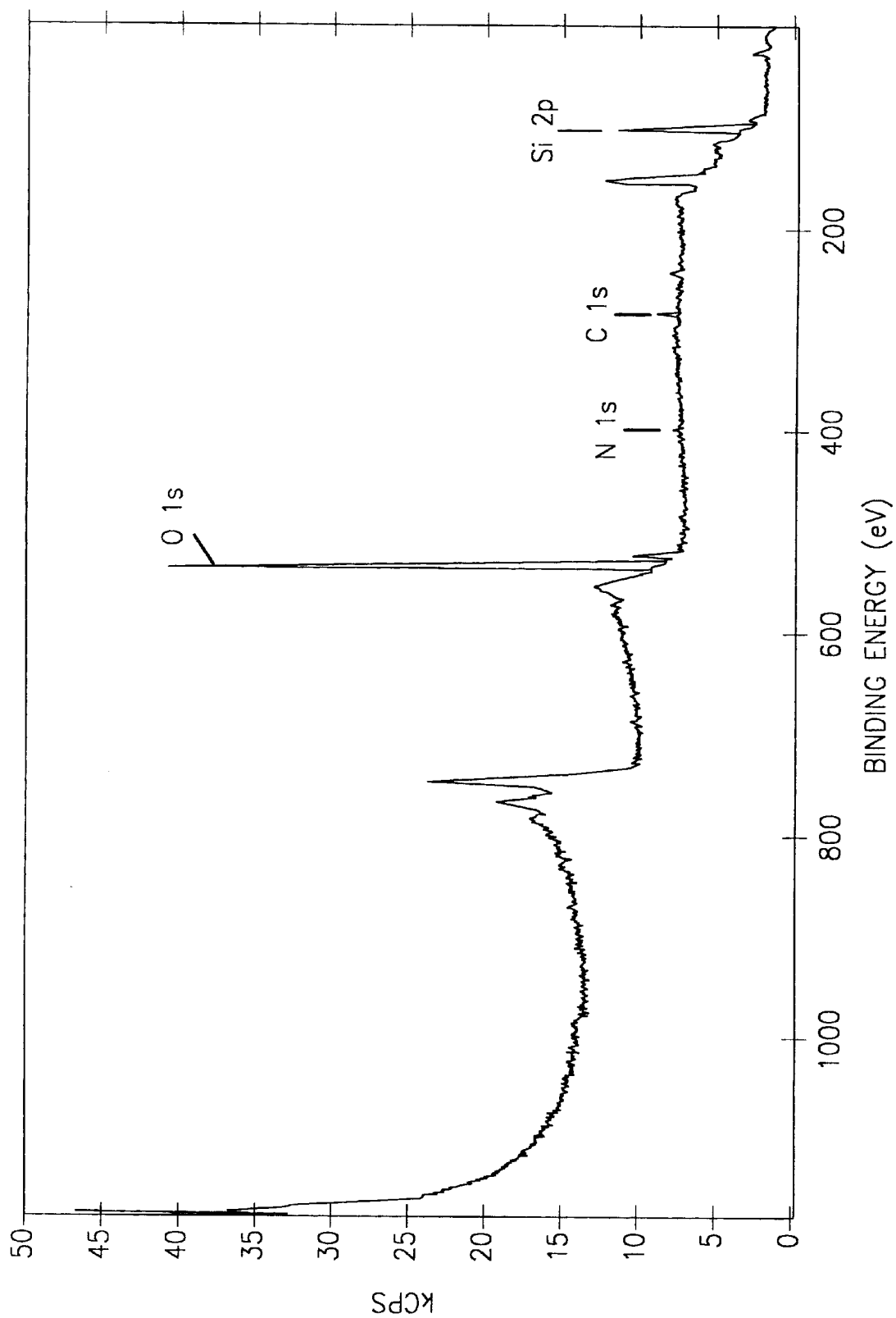
FIG. 3 is a XPS surface survey of an RTWCG SiOX oxide (about 12 nm thick), grown on p-type Si in BS:B19 solution.
Figure 4:
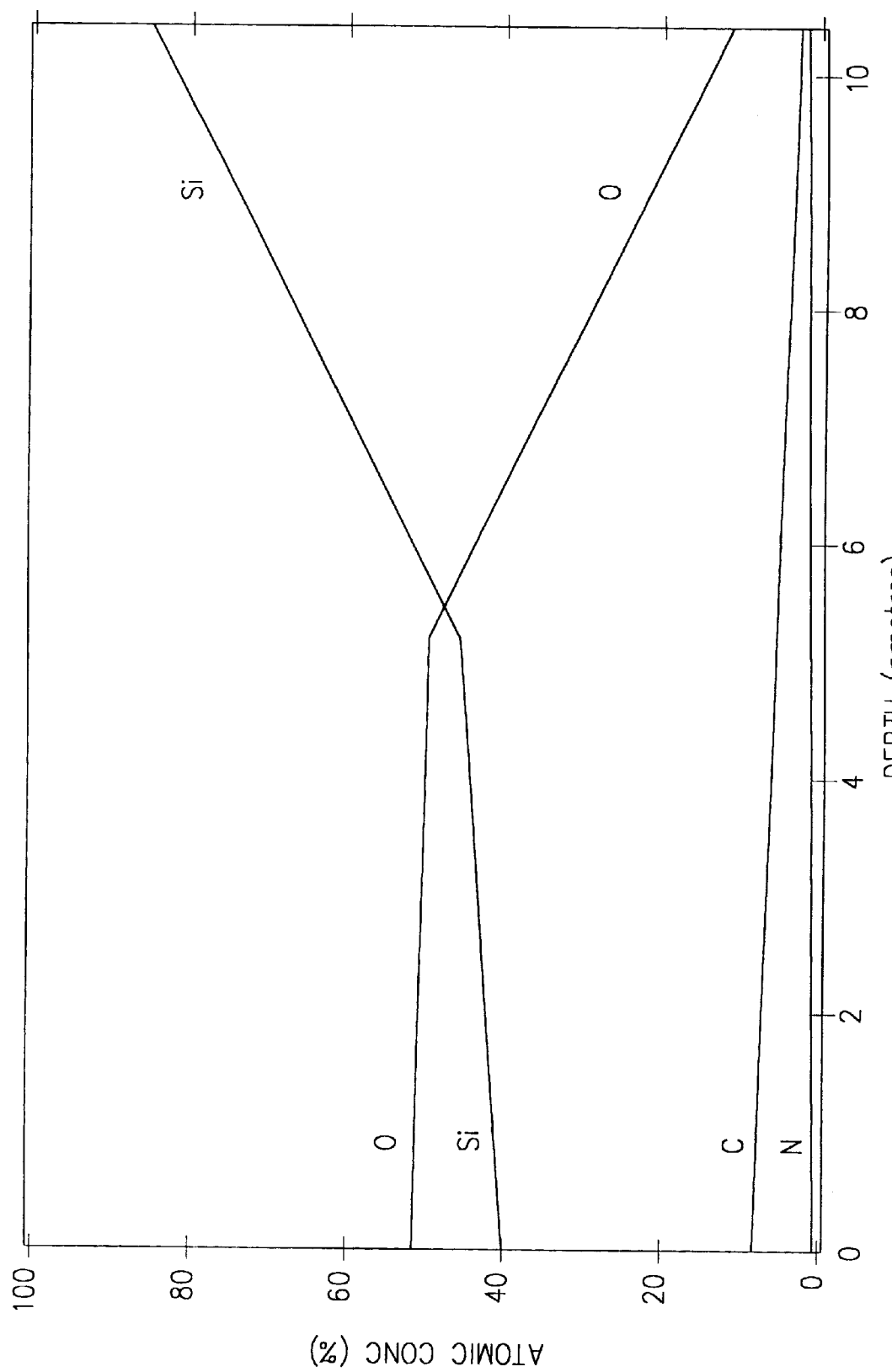
FIG. 4 is a depth profile of oxide in FIG. 3.

Quantitative XPS analysis of oxides grown on p-Si using basic BS solutions indicates that the carbon contained at the surface of the oxide layer is a factor of 1.5 to 2 times greater, while the Fe and F contaminants decrease by a factor of 5 to 10 when $NH_4F$ solutions is added to the KOH solutions. However, the growth rate of $NH_4F$ based solutions, decreases quite significantly compared to the KOH based solutions. Adding NaF solutions further decreases the deposition rate, without increasing F contamination. FIG. 3 is a XPS surface survey of an RTWCG SiOX oxide (about 12 nm thick), grown on p-type Si in BS-B19 solution. The BS-B19 growth solution was made by mixing 5 volume parts of 34% HSiF, 3 volume parts of 5% n-BPCl aqueous solution, 3 volume parts of 0.5 M KOH, 1 volume part each of 0.1 M $NH_4F$ and 0.1 M NaF aqueous solutions, and with 0.5 g M KFeCN/100 ml solution. The growth time was 6 minutes, and the growth rate was only about 2 nm/min. FIG. 4 shows the depth profile of this oxide. At the surface of the SiO-rich oxide, C replaces Si. The C concentration decreases from about 8.3% at the surface to near zero at the oxide/Si interface. The N concentration increases from 0.27% at the surface of the oxide to about 1.5% at the oxide/Si interface. The large surface C concentration and relatively large N interface concentration might explain the excellent chemical, UV and thermal stability, and, respectively, the excellent surface passivation capability of this oxide as shown in Example 5.

Figure 5:
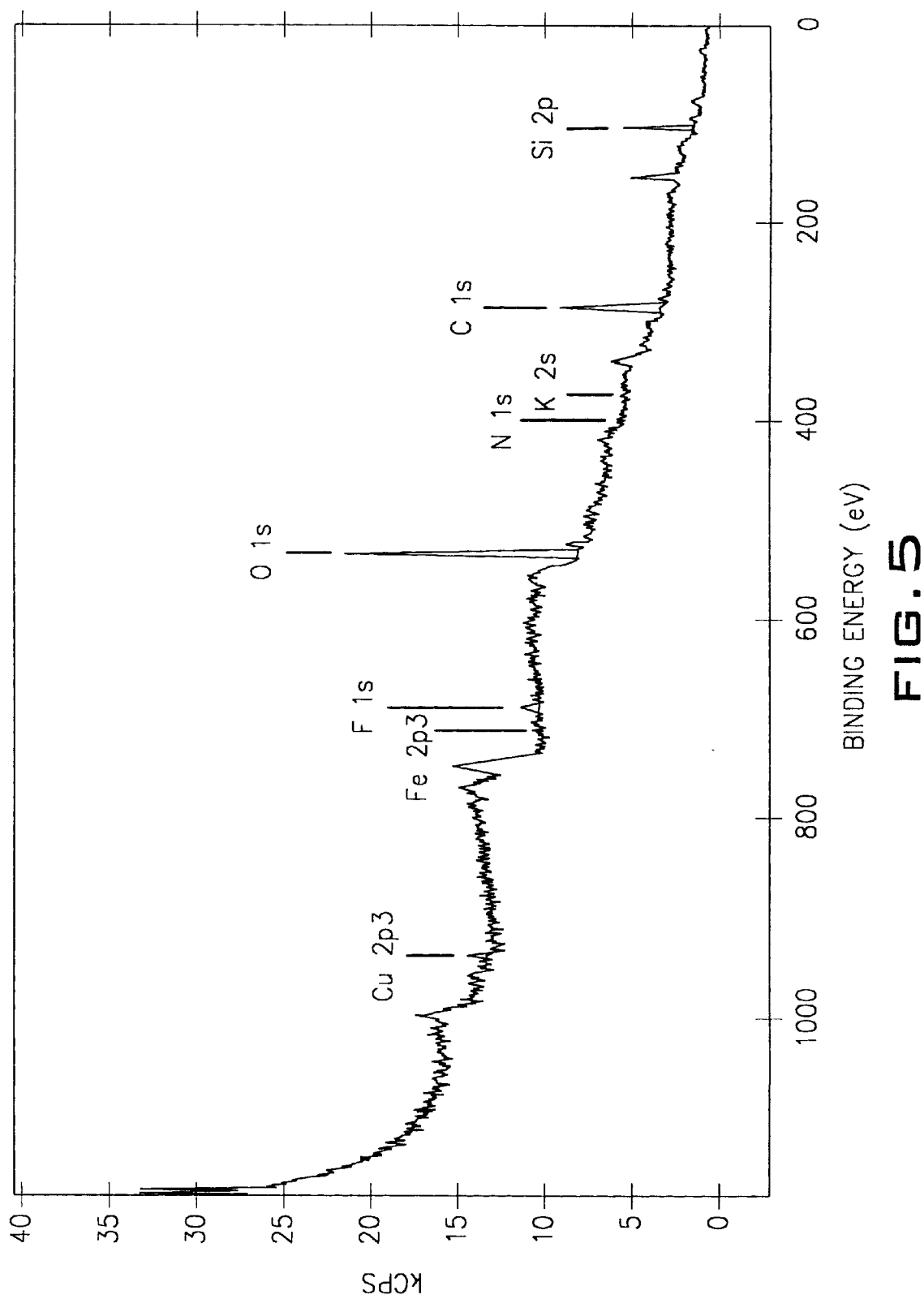
FIG. 5 is a XPS surface survey of an RTWCG SiOX oxide, grown on p-type porous Si in BS:PS6 solution.

Our experimental data show that thin film RTWCG SiOX based oxides can be grown on porous silicon (PS) and the use of these coatings increase the stability of PS material against aging. RTWCG thin film SiOX layers are relatively easy grown on PS in both mild acidic and mild basic BS solutions. In a preferred embodiment of the invention, the growth solution BS-PS6 was made by mixing 5 volume parts of 34% HSiF with 3 volume parts of 5% n-BPCl aqueous solution, 3 volume parts of 0.5 M KOH, 1 volume part 0.1 M NaF aqueous solutions. Then 0.2 g KFeCN/100 ml solution is added. The solution is agitated until complete dissolution of the KFeCN crystals. FIG. 5 is a surface survey of a SiOX coated PS. The PS was formed chemically on a (100) p-Si substrate, by the known process of stain etching using a solution based on HF and HNO3. Then, a RTWCG SiOX thin film was grown on the PS surface using the above, BS-PS6 solution. Table 3 gives XPS data recorded at the surface of the oxide in FIG. 5.

Due to the topography of the PS surface, the growth rate has only been estimated from the color code to be from 40 nm/minute to 50 nm/minute. The growth rate on planar p-si substrates, using the BS-PS6 solution was at least 3 times smaller compared to the estimated growth rate on PS. Furthermore, differences exist in the chemical composition of the two oxides, grown on planar and PS using similar p-Si substrates. For instance, the C surface concentration of a 52 nm thick oxide grown on planar Si was 9.6%, compared to 36.5% at the surface of the oxide grown on PS. Also, the F concentration at the surface is about twice on PS compared to the planar surface. Although not very accurate, due to its surface topography, after 180 seconds sputtering, which corresponds to the removal of about 30 nm, the Si, C, and O concentrations became 39.283%, 18.895%, and 37.803% respectively. At the same depth the Fe, and F concentrations decreased to 0.11% and 0.646% respectively, while the N concentration became 0.443%. The origin of the Cu 2p3 line is unknown. Since it is does not appear in the oxide grown on the planar Si, Cu could have been introduced into the PS during the stain etching step. This seems to be the case since the Cu concentration after the 180 sec. sputtering has increased to 2.821%. The role of Cu, if any, in the above differences observed in the composition of the oxides grown on PS and planar Si, deserve further investigation.

High RTWCG rates of SiOX dielectric layers of up to 64 nm/minute according to this invention are possible using mild basic BS based solutions, when pH is kept between 7 and 9. One way to increase the growth rate is to use $H_2TiF_6$ or $TiCl_4$ or $(NH_4)_2TiF_6$ into the growth solution. For example the BS:Ti solutions, using $H_2TiF_6$ to enhance the grow rates of RTWCG SiOX oxides on Si are made of 3 to 5 volume parts of 34% HSiF mixed with 0 to 4 volume parts of 5% n-BPCl aqueous solution, 1 to 3 volume parts of 0.1 M $NH_4F$, 0 to 2 volume parts of 0.1 M NaF aqueous solutions and 0.5 to 2 volume parts of 60% $H_2TiF_6$. Then 0.1 to 1 g KFeCN/100 ml solution is added. The solution is agitated until complete dissolution of the KFeCN crystals.

TABLE 3

Quantification Table for Experiment BS-PS6. Surface.

| Peak | Center (eV) | Norm. Area | [AT] % |
|---|---|---|---|
| Cu 2p3 | 934.5 | 11.049 | 0.495 |
| Fe 2p3 | 710.0 | 4.6986 | 0.21 |
| F 1s | 688.5 | 35.543 | 1.592 |
| O 1s | 532.5 | 702.095 | 31.439 |
| N 1s | 399.0 | 0 | 0 |
| K 2s | 373.5 | 0 | 0 |
| C 1s | 284.5 | 815.133 | 36.501 |
| Si 2p | 102.5 | 664.650 | 29.763 |

Figure 6:
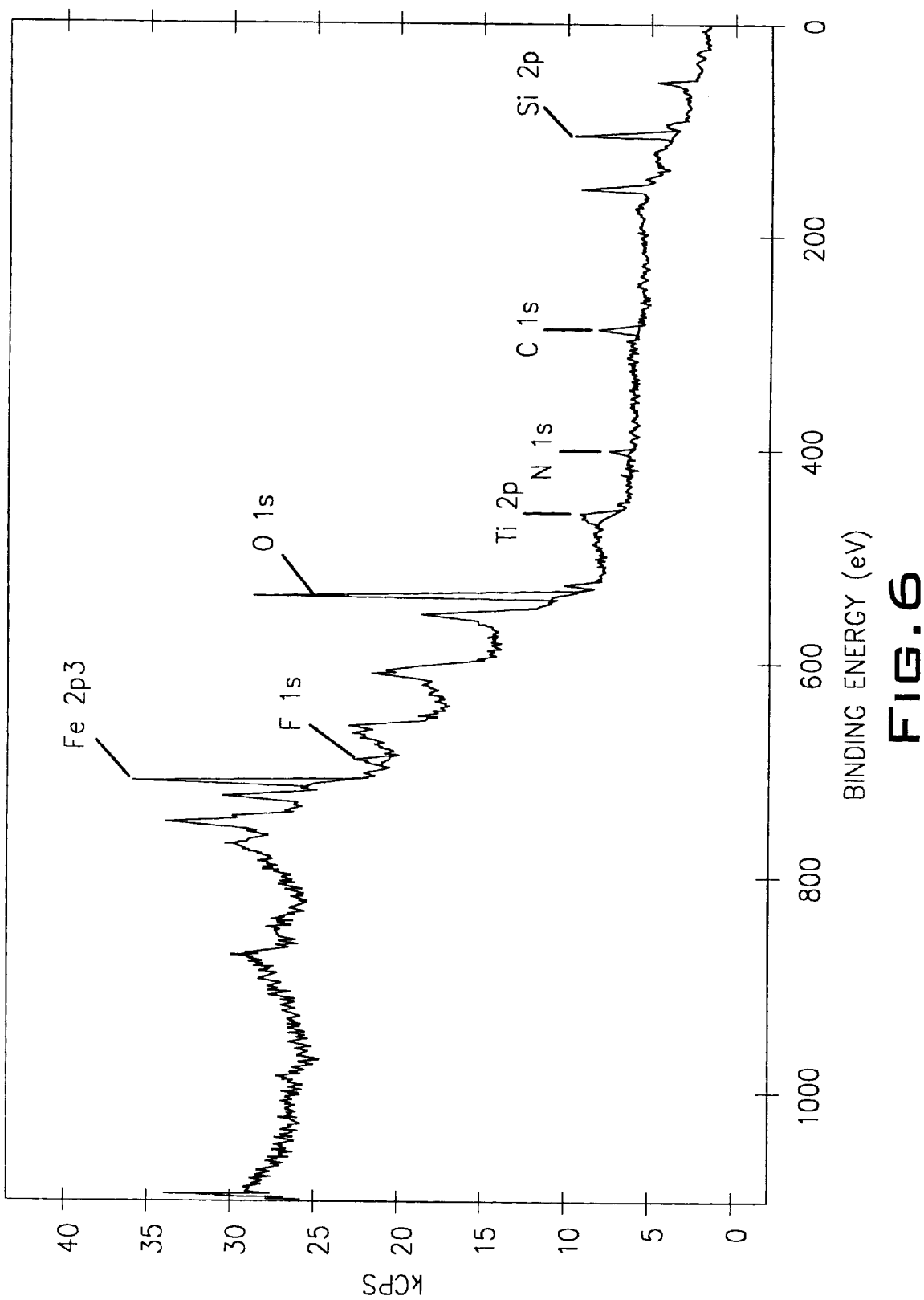
FIG. 6 is a XPS surface survey of an RTWCG SIOX oxide (235 nm thick), grown on p-type Si in BS-Ti34 solution, after the removal of about 13 nm from the surface.

FIG. 6 is a XPS surface survey of an RTWCG SiO oxide (about 70 nm thick), grown on p-type Si in BS-Ti34 solution. This growth solution was made by mixing 5 volume parts of 34% HSiF with 2 volume parts of 5% n-BPCl aqueous solution, 1 volume part each of 0.1 M $NH_4F$ and 0.1 M NaF aqueous solutions, 2 volume parts of 60% $H_2TiF_6$. and 1 g/KFeCN/100 ml solution. The larger than needed $H_2TiF_6$ and KFeCN amounts in this example were chosen to study the oxidation stage of Ti and Fe included into the grown oxide. The growth time was 75 seconds, and the thickness of the oxide was 70.4 nm, and therefore the growth rate was of 56.3 nm/min. An oxide, grown simultaneously in the same solution, but extracted after 5 minutes had a thickness of 285 nm, that is a growth rate of 57 nm/minute. Table 4 gives XPS data recorded after sputtering 13 nm from the surface of the oxide in FIG. 6.

TABLE 4

Quantification Table for Experiment BS-Ti34. Sputtered 13 nm.

| Peak | Center (eV) | Norm. Peak Area | [AT] % |
|---|---|---|---|
| Fe 2p3 | 706.81 | 86.426 | 10.516 |
| F 1s | 688.5 | 28.363 | 3.451 |
| O 1s | 532.5 | 296.168 | 36.035 |
| Ti 2p | 397.4 | 31.531 | 3.836 |
| N 1s | 284.5 | 28.220 | 3.434 |
| C 1s | 284.5 | 89.368 | 10.874 |
| Si 2p | 102.5 | 261.813 | 31.855 |

Figure 7B:
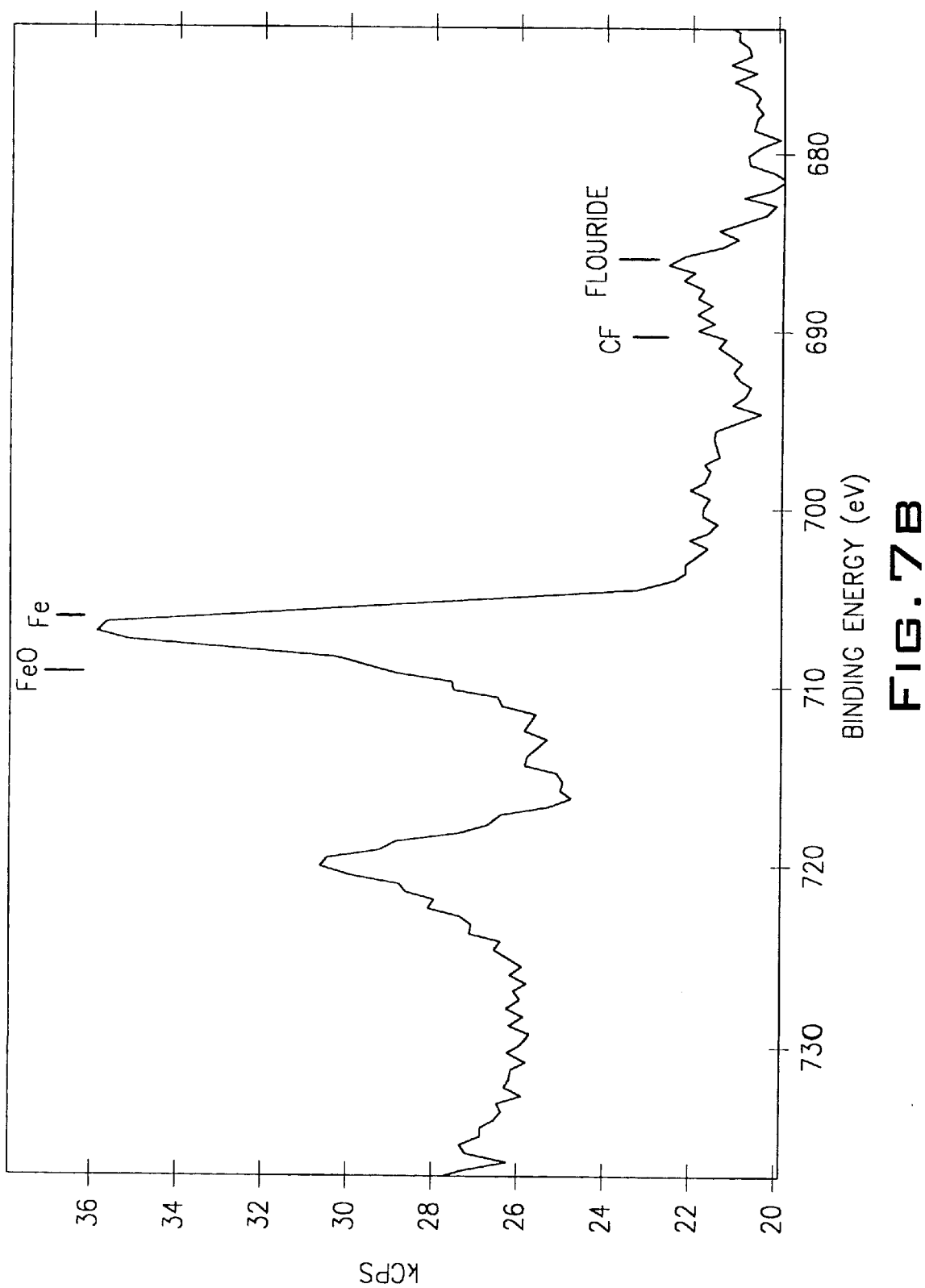

A depth profile of the above oxide components was acquired. At the surface the Fe, C and N concentration were about 11.5%, 38%, and 27%, respectively. Within the top 26 nm, their concentration steadily decreased to below 2% each, and their concentrations continued decreasing to zero toward the oxide/Si interface, except for the N, which still had a concentration of 0.58% near the interface. The Ti and F concentrations had a minimum at the surface of the oxide, e.g. 2.6% (Ti) and 0.15% (F), then their concentrations steadily increased to 40 nm, where they had a maximum of 4.8% (Ti) and 4.4% (F), and their concentration decreased steadily toward the interface, F with a larger rate. The large Ti and Fe concentrations should not recommend this oxide for most device applications, except if the Ti and Fe exist as oxides. A closed examination of Fe 2p3, and Ti 2p peaks (FIG. 7a, and FIG. 7b), suggest that toward the surface of the oxide Ti and Fe are a mixture of metallic and oxide components. However, toward the oxide/Si interface both Ti and Fe appear to be completely in an oxide form.

The foregoing and other objects, features and advantages of the invention will be apparent from the following more particular examples of preferred embodiments of the invention.

EXAMPLE 1

Low dielectric constant SiOX thin films for intermetallic dielectric (IMD) and interlevel dielectric (ILD) for ultra large scale integrated (ULSI) silicon based microelectronics.

Integrated circuit miniaturization continues to well below the half-micron level in the quest for higher speed and greater efficiency. At such reduced dimensions, the relatively high dielectric constant and resulting capacitance of conventional interlayer dielectric materials work to limit signal speed, create cross-talk and consume excessive power.

In the last two decades or so, there has been a continuous search for an alternate gate dielectric to $SiO_2$ grown by thermal oxidation, needed for a series of applications such as the high speed, high performance large scale integrated (LSI), very large SI (VLSI) and ultra large SI (ULSI) circuit processes. The search continues for alternate to $SiO_2$ layers and process technologies for 0.25 µm and beyond microelectronics. The high-density plasma CVD (HDP-CVD) deposited SiOF has already been used to fill 0.35 µm gaps, and is also a contender for the 0.25 µm and even for the 0.18 µm gaps, although it has proven very difficult to implement even for the 0.25 µm gaps due to problems associated with the chemical-mechanical planarization (CMP) process. Hence, a selective growth of SiO-based films for fully planarized multilevel interconnections so as to eliminate the CMP process is very attractive for VLSI and ULSI device applications.

For 0.25 µm, 0.18 µm, 0.13 µm, 0.10 µm and beyond, work is under development on a variety of materials that can provide dielectric constants between 2 and 3 (e.g. fluorinated polymides; non-polymide C-H polymers; fluoro-polymers; siloxane polymers and parylenes, to name a few). All of these materials are just now beginning to be fully characterized, and, so far, the biggest common concern is their relatively poor thermal stability. The main disadvantages of conventional insulating films for VLSI (ULSI) applications include:

poor compatibility with multilevel interconnection, postdeposition planarization introduces stress, as well as chemical and particle contamination relatively poor thermal, UV, and plasma stability.

high temperature; low growth (deposition) rate relatively poor step coverage, high investment cost Using the RTWCG process and mild basic (pH from 8 to 9) BS solutions we were able to grow SiOX insulator layers on 2 to 4 inch (100) and (111) p-Si and n-Si substrates. These insulator layers have:

a thickness from about 0.01 to 0.90 µm (as determined from ellipsometry)

a growth rate of up to 64 nm/min.

measured static dielectric constant between 2.95 and 4.8 very good uniformity good chemical and thermal stability

Figure 8:
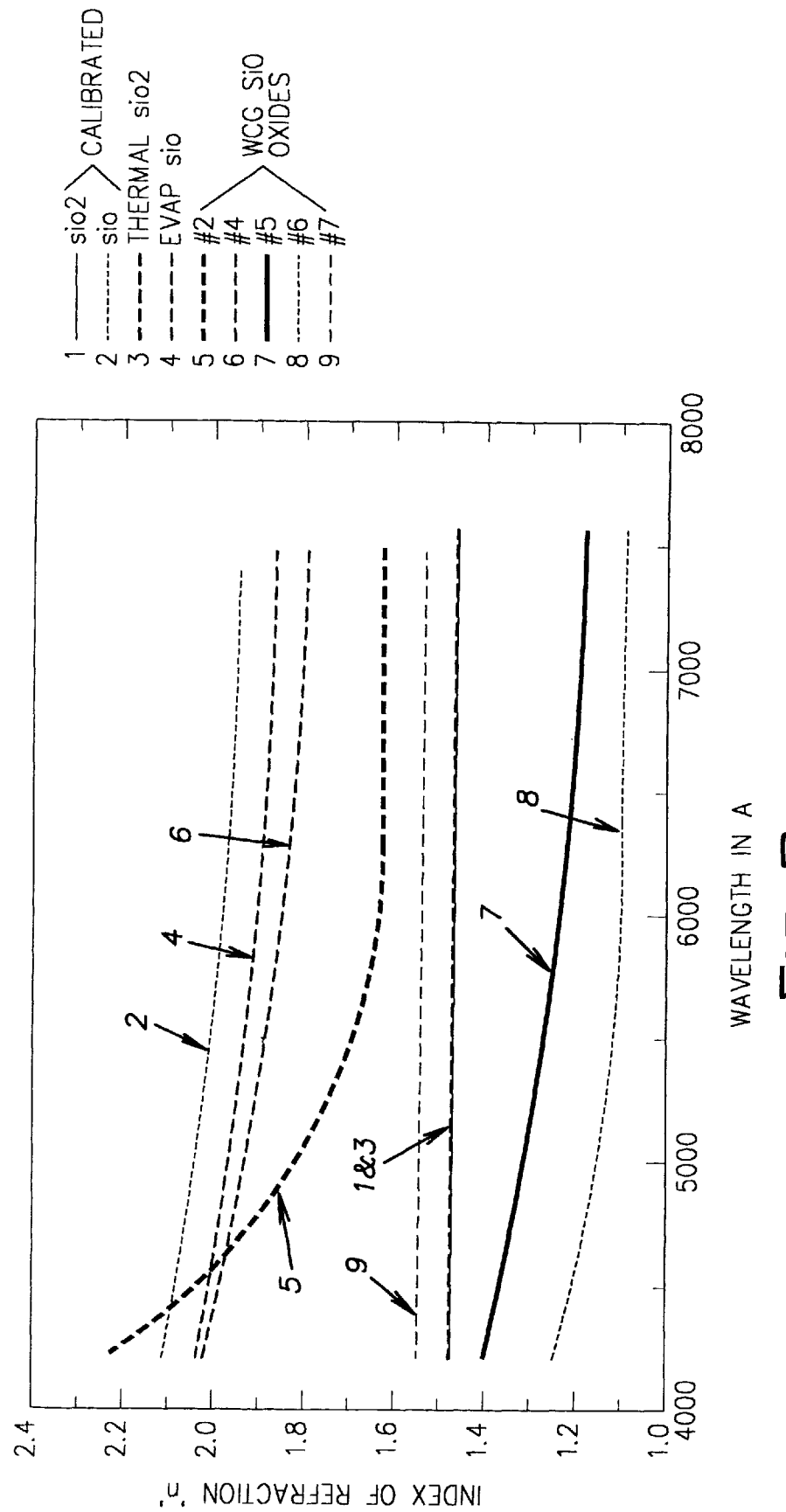
FIG. 8 are plots of index of refraction against wavelength for selected RTWCG SiOX-based thin film oxide layers grown on (111) p-type silicon substrates.

In FIG. 8 are given plots of ellipsometric data of selected five SiOX chemical oxides. For comparison, also are given plots for a thermally oxidized $SiO_2$ and resistive evaporated SiO, respectively grown/deposited on similar p-Si substrates.

In developing the WCG processes for room temperature growth of SiOX based insulators, the chemical composition and the chemical structural features of the liquid molecules must ensure the proper length, reactivity, permanent dipole momentum and surface tension so allow uniform growth of stable oxide layers of controllable composition and thickness. For example because the insulator film is grown in liquid state, if the liquid precursors of the growth solution are properly selected, the surface tension forces inside spaces with critical features of 0.25 µm and beyond and high aspect ratio will pull the film flat—a selfplanarization effect. This is extremely important for developing self-planarizing growth processes of intermetallic dielectric films, interlevel dielectrics, and shallow trench isolation of ULSI Si-based micro- and nano-electronics.

The above requirements necessitate complex interdisciplinary theoretical and experimental studies of fluid dynamics, electrochemistry, physics of the interfaces, etc. For instance, the flow and range of interaction forces between complex liquids and the nanostructure surfaces cannot be solved by the known dynamic and kinetic-molecular theories of liquids. Moreover, the Laplace type forces, determined by the internal fluid pressure, are drastically modified by the physical-chemical interactions of complex liquid molecules with the surfaces of the nanostructures with various geometries.

We have been able to prove that the RTWCG SIOX oxide layers can be made compatible with metallization schemes, including Cu and Ag, and photoresists. Due to its excellent gap filling capability, this room temperature process could become the process of choice for fully planarized multilevel interconnections for ULSI microelectronics with high aspect ratio and features size of 100 nm and beyond, for which none of the presently known techniques seem to work.

For measuring the static dielectric constant, we fabricated MOS capacitors using RTWCG SiOX oxides. For the fabrication of Al/as-grown RTWCG oxide/p-type Si/Au:Ti MOS capacitors (with gate areas from $2\times10^{-4}$ cm$^2$ to $2\times10^{-3}$ cm$^2$), the SiOX oxides were grown after the ohmic back contacts were made, and no further annealing steps were used in the fabrication of MOS capacitors. We also fabricated MOS capacitors using thermal SiO$_2$ so as to check the validity of our measured values. The thickness of the SiOX and SiO$_2$ layers was measured using a Dektak profiler.

Table 5 gives the solution growth, the oxide thickness for the reference thermal SiO$_2$ and selected RTWCG SIOX oxides, the average refractive index (400 to 800 nm wavelength range) as determined from ellipsometry, and the static dielectric constant, measured at 1 MHz.

TABLE 5

Static dielectric constant vs. average refractive index in the visible spectra (1 = 400 to 800 nm) for RTWCG SiOX oxides grown on (100)p-Si. Growth time: 4 to 25 minutes.

| Solution | Oxide Thickness (nm) | Av. Refractive Index | Dielectric Constant |
|---|---|---|---|
| Thermal SiO | 108 | 1.492 | 3.95 |
| BS:B15 | 208 | 1.365 | 3.08 |
| BS:PS6 | 107 | 1.353 | 2.95 |
| A4:Pd | 135 | 1.492 | 4.33 |
| BS-Ti34 | 801 | 1.542 | ~4.80 |

EXAMPLE 2

RTWCG of SiOX thin films for gate dielectric for ULSI silicon based microelectronics.

In the last two decades or so, there has been a continuous search for an alternate gate dielectric to SiO$_2$ grown by thermal oxidation, needed for a series of applications such as the high performance ULSI. The SiO$_2$ has already been replaced by slightly modified SiO$_2$, i.e. oxynitrides.

For the development of electronic devices with critical features below 100 nm, the thickness of the insulator layers has to be scaled down accordingly, but retain its passivating and dielectric properties. As an example, for use as a gate dielectric of modern MOS transistors the oxide thickness will be in the range of 6–10 nm for 0.35 µm generation technologies and will scale to less then 4 nm for 100 nm and beyond technologies. To our knowledge none of the already developed or recently proposed insulator layers would satisfy the technological requirements of high-speed, low-power nanoelectronics with critical features of below 100 nm.

Based on our preliminary investigation the RTWCG SiOCN oxide grown in solution BS-B19 (see FIG. 3 and FIG. 4), could be a good candidate for use as a gate insulator for low-power, high-speed integrated nanoelectronics. The growth rate of this oxide on (100) p-Si substrates is only about 2 nm/minute, which should allow a good thickness control of the growth of 4 to 6 nm thick oxides. The large surface C concentration and relatively large N interface concentration might explain the excellent chemical, UV and thermal stability, and, respectively, the excellent surface passivation capability of this oxide. Although we have not yet measured it, based on its chemical composition and ellipsometric data, we estimate ultra thin film SiOCN oxides would have a dielectric constant lower than 3.

EXAMPLE 3

SiO-based insulator for surface passivation for photonic (optoelectronic) device applications.

If the insulating layer is deposited directly on the Si surface, it is imperative that it provides good passivation of the surface. This is an important aspect, very often overlooked in developing insulator layers. This is difficult to achieve for future IC electronic and optoelectronic structures with shrinking feature size using traditional dielectric growth/deposition techniques. Based on our preliminary data, if well controlled, the SIOX oxides grown by the new RTWCG technique will have better passivating properties of Si surfaces compared for example to inorganic and organic spin-on glasses because the chemical growth should result in uniform and well-defined noncrystalline layers with short range order.

As mentioned in Example 2, the RTWCG SiOCN oxide grown in solution BS-B19 has excellent chemical, UV and thermal stability, and, respectively, excellent surface passivation capability. Its passivating qualities we tested on some n+p Si solar cells. Using solution growth BS-B19 and a growth time of 4 minutes, we grew a 72 nm thick SiOCN oxide on two 4cm$^2$ Si solar cells. On one of these cells we recorded a gain of 63.2% in short circuit current density ($J_{sc}$), e.g. from 23.69 mA/cm$^2$ (bare surface) to 38.66 mA/cm$^2$. This gain was much larger than that expected from the decrease in the reflectivity. For another cell, in similar conditions, we recorded a gain in $J_{sc}$ of 62.8% (oxidized simultaneously with the cell above). After removing the oxide from the surface of the first cell, the $J_{sc}$ became 32.1 mA/cm$^2$, compared with the initial value of 23.69 mA/cm$^2$. This relative increase of about 36.5% we attribute to surface passivation of this bare Si cell, which means that the increase due to the difference in reflection is only about 27%. This is comparable or better with reported increases in $J_{sc}$ using a single layer AR coating.

EXAMPLE 4

SiO-based insulator for use as a single layer antireflection coating for Si-based planar solar cells.

The anti-reflective (AR) coating is one of the most important parts of a solar cell design, as it allows a substantial reduction in the amount of reflected light. For Si, the loss of incident light amounts to 34% at long wavelength (1.1 µm) and rises to 54% at short wavelength (0.4 µm). A proper single layer AR coating can reduce the reflection to about 10%, averaged over this wavelength range, and a double layer AR coating can reduce it to around 3% on the average.

It is a common practice to use physical vapor deposition techniques to deposit the AR coating. For simple cell structures, the layers of AR coating are deposited directly onto the emitter surface by resistive or e-beam evaporation, sputtering and chemical vapor deposition. The most common single layer AR coatings are $MgF_2$, $SiO_2$, SiO, $TiO_2$ and $Ta_2O_5$. For high efficiency space solar cells, the most commonly used double layer AR coating is $ZnS/MgF_2$. All of the above deposition methods are known to destroy the stoichiometry at the cell's front surface, which, by increasing the scattering at the grain boundaries, decreases the AR coating/semiconductor interface transparency and introduces additional defects at the emitter/AR coating interface. For this reason, high efficiency III–V based space solar cells use a window layer grown on the surface of the emitter prior to depositing the layers of the AR coating. This window layer partially reduces the degradation effects mentioned above. Lattice-matched window layers are grown by epitaxy; this increases the cost and reduces the yield of finished cells. Radiation induced defects at the window/emitter layer interface is an additional concern for the design engineers of space solar cells.

We started a preliminary investigation to test the overall quality of large growth rate RTWCG SiOX oxides using BS solutions such as BS:B15, BS:B19, and BS-Ti34 by using them as passivation/first layer AR coating for planar Si cells.

For our preliminary study we used several dozens readily available planar 2×2 cm$_2$ n/p Si solar cells with AMO, 25° C. efficiency of about 7% (bare cells). Before the measurements, the front surfaces of the bare cells were cleaned with organics, followed by a short dip into a 2% HF solution. RTWCG SiO-based coatings were then grown in the BS-Ti34 chemical system.

Figure 9:
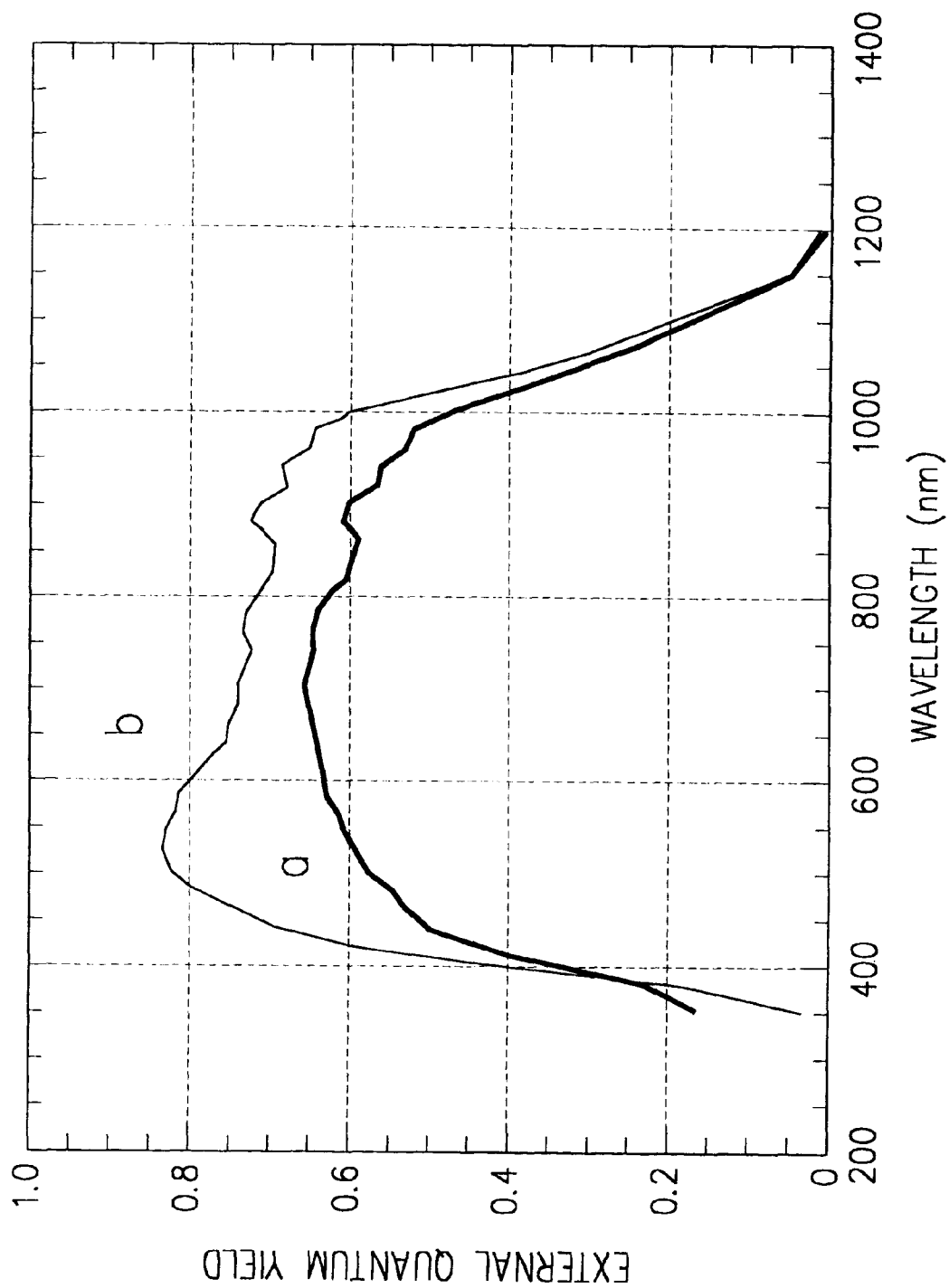
FIG. 9 are plots of external quantum efficiency against wavelength for a 4 $cm^2$ Si solar cell with (a) bare and (b) RTWCG SiOX-based AR coating.

The variation in external quantum efficiency os one such bare cell before (a) and after the RTWCG SiOX oxide grown in the BS-Ti34 chemical system (b) is shown in FIG. 9.

The performance parameters, a selection of which are given in Table 6, were measured at NASA LeRC prior to and after the coatings, under AMO, 25° C. conditions.

Table 6. AMO, 25° C. performance parameters of selected 2×2 cm$^2$ n/p Si cells prior to (bare) and after RTWCG of SiO-based coatings in the BS-Ti34 chemical system. Growth time: 3 to 5 minutes; thickness: 95 to 120 nm; No annealing.

Note that I$_{sc}$ values for the cells in Table 6, increase significantly after RTWCG of SiO-based coating, while the V$_{OC}$ values remain practically unchanged. The explanation might have to do with the fact that the surfaces of the 10–15 years old planar cells could not be properly cleaned, prior to growing the SiO-based coating, without removing some or all front grid fingers. For these cells, using mild acidic solutions of the BS:B15 type chemical system, it should possible in one step to remove the nonstoichiometric (dead) front surface layer, passivate the surface, and grow a good quality AR coating.

EXAMPLE 5

RTWCG SiOX based insulators for use as a passivating/single layer antireflection coating for Si-based concentrator vertical multifunction (VMJ) silicon solar cells.

Light-induced effects in the Si/insulator interface are known to adversely affect the solar cell performances. Although these light-induced effects affect especially surface sensitive devices such as the silicon inversion layer solar cells, these effects have also been reported for high efficiency silicon point-contact solar cells after extended exposure to concentrated sunlight. The light-induced degradation is due to the generation of fast surface states at the silicon/insulator interface. For terrestrial solar cell applications this effect can be minimized, since cover glass and

|  | Bare Cell | | | | Coat. Cell | | | | |
| --- | --- | --- | --- | --- | --- | --- | --- | --- | --- |
| Cell | I$_{sc}$ (mA) | V$_{oc}$ (mV) | FF (%) | η (%) | I$_{sc}$ (mA) | V$_{oc}$ (mV) | FF (%) | η (%) | (η, ox-η, bare)/ η, bare (%) |
| Cox 12 | 89.2 | 583.9 | 75.2 | 7.16 | 118.0 | 579.5 | 75.0 | 9.45 | 32.0 |
| Cox 27 | 88.0 | 573.1 | 70.4 | 6.49 | 117.2 | 572.7 | 71.8 | 8.81 | 35.7 |
| Cox 23 | 88.3 | 570.9 | 68.7 | 6.33 | 119.9 | 571.0 | 69.5 | 8.69 | 37.3 |

After the SiO-based coatings, the only treatment the cells received prior to the AMO measurements was rinsing them into DI water and drying them in N$_2$. The large increase in the efficiency of these cells, after the RTWCG SiO-based coatings, are due to a very good optical quality of coatings grown in the BS-Ti34 chemical system. However, although the passivating property of this coating is better than that of some commercial AR coatings, it is not yet as good as that of coatings grown in the BS:B15 and BS:B19 chemical systems. The reason for this is the relatively large amounts of metallic components (Ti in this example), which still exist in the high refractive index interfacial M—O rich Si—O—X layer, as revealed by the XPS spectra, such as the one shown in FIG. 7a. The SiOX oxide used for cell "12" in Table 6 was grown in identical conditions as the one in FIG. 6. The coating used for cell "23" had a lower concentration of metallic Ti, compared to cell "12" as revealed by the better defined TiO$_x$ peaks, with a smaller shoulder toward the metallic Ti.

As seen in Table 5, by varying the chemistry of the solution growth it is possible to deposit SiOX AR coatings with tailorable index of refraction by including various amounts of Ti—O and N—O groups into the SiOX layer. RTWCG of SiOX coatings is possible on surfaces with existing metallization such as with grid fingers on solar cell or thermophotovoltaic (TPV) cell surfaces. Therefore, once metallization has been done on the cell, and after chemical removal of nonstoichiometric front surface layers, insulating WCG SiOC coatings can be used for the dual purpose of surface passivation and as AR coating.

suitable encapsulants act as a filter cutting off the energetic wavelengths (λ<335 nm) which are mainly responsible for light induced degradation of solar cell performances. For concentrator solar cells in general and point-contact and VMJ Si solar cells in particular, however, these effects cannot be neglected.

Vertical MultiJunction (VMJ) Si solar cells, (U.S. Pat. Nos. 4,332,973; 4,409,422, and 4,516,314) show a good promise for use as concentrator solar cells. One of the biggest challenge in fabricating high efficiency, stable VMJ cells is the difficulty, using traditional techniques, to passivate the two back and front surfaces, and the two non-metallized edge surfaces.

For this preliminary experiment some early Vertical MultiJunction (VMJ) Si solar cells were provided to us by the VMJ Si solar cell developer, PhotoVolt, Inc. The biggest contributor to efficiency loss in the Si VMJ cell structure is the fact that its illuminated and back surfaces, and the two edge surfaces uncovered by metallization, are high recombination surfaces with exposed junctions that are difficult to passivate. Also, traditional AR coatings are difficult to form on these cells because of temperature constraints and because of their configuration with the four exposed surfaces. The RTWCG process grows SiO-based oxides simultaneously on the four exposed surfaces. These coatings, grown at room temperature, are easy to apply, are stable, passivate well the VMJ Si cell surfaces, and act as an effective AR coating. Some results are given in Table 7.

Table 7. I$_{sc}$ and V$_{Oc}$ of two VMJ Si cells after chemical passivation (by PhotoVolt) of bare cells, and after RTWCG of SiOX coatings. Growth time: 4 minutes; Oxide thickness: about 120 nm. No annealing.

| Cell | Bare Cell | | Coat. Cell | | ($I_{sc}$, ox – $I_{sc}$, bare)/ $I_{sc}$, bare (%) | ($V_{oc}$, ox – $V_{oc}$, bare) $V_{oc}$, bare (%) |
|---|---|---|---|---|---|---|
| | $I_{sc}$ (mA) | $V_{oc}$ (V) | $I_{sc}$ (mA) | $V_{oc}$ (V) | | |
| PV 414 | 0.398 | 12.57 | 0.52 | 14.22 | 30.7 | 13.1 |
| PV 412 (Side 1) | 0.385 | 13.31 | 0.56 | 14.55 | 45.6 | 9.3 |
| PV 412 (Side 2) | 0.425 | 13.17 | 0.57 | 13.95 | 34.1 | 5.9 |

Notes: VMJ Si solar cells with their multiple (16 to 40) exposed junctions are probable the most surface sensitive solar cells. The biggest contributor to efficiency loss in the Si VMJ cell structure is the fact that its illuminated and back surfaces are high recombination surfaces with exposed junctions (up to 40) which are difficult to passivate. After the SiOX coatings, the only treatment the cells received prior to the AMO measurements was rinsing them into DI water and drying them in $N_2$. The RTWCG SiOX coated VMJ cells surpassed the performances and UV stability of cells with resistively evaporated $Si_3N_4$, SiO and $Ta_2O_5$ AR coatings. We attribute this to the intrinsic good passivating and optical quality of the RTWCG Si—O—C—N oxide.

On some Si VMJ cells with $Ta_2O_5$ as an AR coating, after 1 hour exposure to high intensity (about 50 mW/cm$^2$) near UV light, the drop in the performance parameters was as high as 20%. After the exposure, the cell performance parameters completely recovered after only about 30 minutes, which suggests that fast surface states at the $Ta_2O_5$/Si interface were responsible for the performance parameters drop. After removing the $Ta_2O_5$ layer, passivating the surfaces using a RTWCG SiOCN oxide (solution BS-B19), the cell performance parameters increased by as much as 50%. Additionally, no UV degradation was observed even after exposure to the aforementioned halogen light for as long as 5 hours. In fact, for some cells, with similar surface treatments, measurements performed in the PV branch at NASA LeRC under AM0, 25° C. conditions, showed even a small increase in performance parameters after prolonged light exposure.

For solar cell and especially surface sensitive solar cell applications, such as vertical multijunction (VMJ) solar cells, the surface recombination velocity has to be made as small as possible. This means that metallic and carbon impurities, have to be kept a low concentration at the oxide/semiconductor interface. This means the amount of Fe or Ti present in some of our SiOX oxides should be kept at a very low level. In order to preserve a low SRV, our experimental results show that high growth rate solutions such as BS-Ti34 can be used, however the UV stability of VMJ cells coated with SiOX using this solution is not as good as when BS:PS6 or BS:B15 or BS:B19 solutions were used.

EXAMPLE 6

SiO-based insulator for use as passivating films for porous silicon coated photonic (optoelectronic) devices.

Chemical stabilization of the PS material and conservation (or enhancement) of the luminescence efficiency are two current challenges confronting the development of porous-silicon-based photonic (optoelectronic) device applications.

As is known, good chemical stability is obtained upon oxidizing the PS surface, either thermally or by anodic oxidation. But this does not appear as a promising route for device application, because this impedes electrical carrier injection. On a single-crystal planar silicon surface, the hydride passivated surface is known to exhibit a fair stability against oxidation and contamination, at least on a time scale of a few hours. In contrast, the PS surface is much more prone to oxidation and contamination, and, especially for high porosity samples, the infrared spectra exhibit traces of contaminated native oxide formation, after a few tens of minutes in air. On the other hand, on flat silicon crystals, methloxylation of the surface has been reported as a key factor in order to account for the long-term stability and the low interfacial recombination characteristics in methanol-based photoelectrochemical cells. Similar modifications of the porous silicon surface then appears highly attractive since it might provide a much more stable surface which could be used as a processing step for device applications. In a recent study after formation of PS in concentrated HF electrolyte, methoxy groups were formed trough partial anodic dissolution of the hydrogenated PS surface in anhydrous methanol. The methoxylated surface exhibited improved optical characteristics (increased photoluminescence efficiency and blue shift of the emission), similar to PS anodically oxidized in a nonfluoride aqueous electrolyte. Its stability against aging was also improved as compared to that of the hydrogenated surface, but without reaching the stability of anodically oxidized PS. The relative instability is ascribed to the amount of SiH species, which remain, on the methoxylated is surface upon the modification process.

Basic properties of PS, such as photoluminescence (PL) origin, formation mechanism, and structure, have been extensively studied. Meanwhile, the fundamentals of PS devices are being developed. It is important to develop a corresponding device technology for PS that is compatible with the conventional integrated circuit technology. For example, a key step in the fabrication of PS devices and integrated optoelectronic circuits is the formation of light emitting patterns. This is a difficult process because any postprocessing will seriously affect the properties of PS due to its porous, fragile, and chemically reactive structure. A research team from the University of Rochester and the Rochester Institute of Technology, N.Y. have managed for the first time to integrate a PS light emitting diode (LED) into a conventional microelectronics device" (Semiconductor International, January 1997). The LED is said to be 10,000 times more efficient than the first PS Si LED, fabricated in 1990. The improvements they are envisioning will further boost the efficiency 10-fold and increase its frequency 100-fold. To achieve this, as a first step, we feel they should consider replacing the Si-rich $SiO_2$ layer they are presently using with a better passivating layer and with a lower dielectric constant. The use of Si-rich $SiO_2$, although compared to $SiO_2$ offers the advantage of better withstanding some postprocessing steps such as etching, it is not a good choice for surface passivation, has lower resistivity and dielectric strength, higher dielectric constant, and should be less stable with respect to plasma processing, UV and ionizing radiation.

Recently we started a very preliminary study on the possibility of increasing the stability of PS material against aging using RTWCG grown SiOCN-rich thin film coatings for photonic (optoelectronic) device applications, and in particular for low reflection passivated front surface formation for Si solar cell applications. The PS was formed chemically on (111) and (100) Si substrates, using a solution based on HF and $HNO_3$. Then, a RTWCG of thin SiOX layers were grown at room temperature (see FIG. 5). In FIG.

10 are shown reflectivity plots of: (a) RCA cleaned (100) p-Si wafer, (b) PS coated, (c) RTWCG SiOX passivated PS using A4:Pd solution (see FIG. 1), and (d) RTWCG SiOX passivated PS using BS-PS6 solution (see FIG. 5). As seen, the reflection of SiOX coated PS in curve (c) in the portion of the spectra of interest for solar cells is about 10%, while from 580 nm to 1040 nm the reflectivity of SiOX coated PS in curve (d) is below 4%, which is equal or lower than that of best double layer AR coatings.

The RTWCG process of SiOCN layers on the PS surface, a room temperature process, appears highly attractive for photonic (optoelectronic) device applications, since it will provide a much more stable surface in reducing and oxidizing agents and with respect to factors such as heat, humidity, prolonged exposure to UV light, atomic oxygen and ionizing radiation during postprocessing steps and as a result of exposing the fabricated devices to such environments. Based on our preliminary work, it appears that compared to planar silicon surfaces, good quality WCG SIOCN coatings are much easier to grow on PS coated Si surfaces. The reason for this is not fully understood at the present time.

While the invention has been particularly shown and described with reference to preferred embodiments thereof, it will be understood by those skilled in the art that other changes in form and details may be made therein without departing from the spirit and scope of the invention. For instance Fe-EDTA used in combination with KFeCN increase noticeable the growth rate of SiOX oxides grown in BS-Ti34, but the Fe contamination is slightly larger. From among large number of possible electronic and photonic (optoelectronic) device applications we have only mentioned the six above examples. It will be understood by those skilled in the art that any that these RTWCG SiOX oxides can be grown on other than Si semiconductor substrates, including Ge, III–V and I–III–VI compound semiconductors, and used for a wide range of electronic and photonic (optoelectronic) device applications without departing from the spirit and scope of the invention. Other applications described herein, which make use of various description of these oxides are also covered by this invention. One such example is given below.

EXAMPLE 7

Novel optical technique for Si surface defect revealing.

We have mentioned that using the A4:Pd solution, the growth rate of SiOX oxides on (100) Si is much lower than that on (111) Si substrates. Because of this, on (100) Si substrates, the oxide grows preferentially at the defect areas, which reveal the (111) planes. This art-effect can be used for a non-destructive and very precise way to reveal the surface defects type and density on (100) Si surfaces. In other words, on (100) Si surface the oxide spots which grow preferentially at the dislocation areas can be used as an essentially nondestructive and very accurate technique for revealing the type and density of surface defects (e.g. etch pits, dislocations, and scratches). Using this approach, we consistently recorded from 5 to 10% more surface defects as when using conventional preferential etching techniques. We found that when using the preferential etching techniques the larger the defect density the larger the error in defect density. This is so, since the larger pits, overlap over the smaller ones, which makes it difficult to accurately count their density. Using the new higher resolution technique of preferential oxidation, the defect areas are much better delineated and are much easier to visualize using any high magnification optical or electronic microscope. Using this technique, rapid and accurate automatic surface defects mapping is possible using either reflectivity, room temperature photoluminescence intensity or index of refraction imaging techniques. Because using the solution A4:Pd, the thickness of the underlying (100) Si substrate removed during the RTWCG process is less than 25% of the oxide thickness, and since less than 40 nm thick oxide is needed to easy visualize the oxide spots by any of the above optical techniques, it means that the thickness of the removed material at the dislocation sites is less than 10 nm. This makes this novel technique essentially nondestructive, which should recommend it for large volume process control in Si wafer and device industries.

What is claimed:

1. A method for forming a silicon oxide-based layer on a semiconductor substrate, said method comprising:
   providing a reaction mixture including $H_2SiF_6$, n-n-butylpyridinium chloride, and a $Fe^{2+}/Fe^{3+}$ aqueous reduction-oxidation solution; and
   reacting said mixture with said semiconductor substrate to form said silicon oxide-based layer.

2. A method according to claim 1, wherein said mixture is saturated with a substance including $SiO_2$.

3. A method according to claim 1, wherein said $Fe^{2+}/Fe^{3+}$ aqueous reduction-oxidation solution includes an aqueous solution of $K_3Fe(CN)_6$ or iron ethylenediaminetetraacetic acid.

4. A method according to claim 1, wherein said mixture further includes a catalyst selected at least partially upon the pH of the mixture.

5. A method according to claim 4, wherein palladium II trifluoroacetate is used as a catalyst when said mixture has a pH in the range of from about 4 to about 6.

6. A method according to claim 4, wherein at least one of dihydrogen hexafluorotitanate, titanium chloride $TiCl_4$ and $(NH_4)_2TiF_6$ is used as a catalyst when said mixture has a pH in the range of from about 3 to about 9.

7. A method according to claim 1, wherein the pH of the mixture is adjusted with at least one of NaOH, NaF, KOH, $NH_4F$ and HF.

8. A method for forming a silicon oxide-based layer on a silicon substrate, said method comprising:
   providing a reaction mixture including $H_2SiF_6$, n-n-butylpyridinium chloride, and a $Fe^{2+}/Fe^{3+}$ aqueous reduction-oxidation solution; and
   reacting said mixture with said silicon substrate to form said silicon oxide-based layer.

9. A method according to claim 8, wherein said mixture is saturated with a substance including $SiO_2$.

10. A method according to claim 8, wherein said $Fe^{2+}/Fe^{3+}$ aqueous reduction-oxidation includes an aqueous solution of $K_3Fe(CN)_6$ or iron ethylenediaminetetraacetic acid.

11. A method according to claim 8, wherein said mixture further includes a catalyst selected at least partially upon the pH of the mixture.

12. A method according to claim 11, wherein palladium II trifluoroacetate is used as a catalyst when said mixture has a pH in the range of from about 4 to about 6.

13. A method according to claim 11, wherein at least one of dihydrogen hexafluorotitanate, titanium chloride $TiCl_4$ and $(NH_4)_2TiF_6$ is used as a catalyst when said mixture has a pH in the range of from about 3 to about 9.

14. A method according to claim 8, wherein the pH of the mixture is adjusted with at least one of NaOH, NaF, KOH, $NH_4F$ and HF.

15. A method for forming a silicon oxide-based layer on a silicon substrate, said method comprising:

providing a reaction mixture consisting essentially of $H_2SiF_6$p n-n-butylpyridinium chloride, and a $Fe^{2+}/Fe^{3+}$ aqueous reduction-oxidation solution; and reacting said mixture with said silicon substrate to form said silicon oxide-based layer.

16. A method according to claim 15, wherein said mixture is saturated with a substance including $SiO_2$.

17. A method according to claim 15, wherein said $Fe^{2+}/Fe^{3+}$ aqueous reduction-oxidation solution includes an aqueous solution of $K_3Fe(CN)_6$ or iron ethylenediaminetetraacetic acid.

18. A method according to claim 15, wherein said mixture further includes a catalyst selected at least partially upon the pH of the mixture.

19. A method according to claim 18, wherein palladium II trifluoroacetate is used as a catalyst when said mixture has a pH in the range of from about 4 to about 6.

20. A method according to claim 18, wherein at least one of dihydrogen hexafluorotitanate, titanium chloride $TiCl_4$ and $(NH_4)_2TiF_6$ is used as a catalyst when said mixture has a pH in the range of from about 3 to about 9.

21. A method according to claim 15, wherein the pH of the mixture is adjusted with at least one of NaOH, NaF, KOH, $NH_4F$ and HF.

* * * * *

UNITED STATES PATENT AND TRADEMARK OFFICE
CERTIFICATE OF CORRECTION

PATENT NO. : 6,080,683
DATED : June 27, 2000
INVENTOR(S) : Maria Faur, et al.

It is certified that error appears in the above-identified patent and that said Letters Patent is hereby corrected as shown below:

Title page,
Item [54], line 2 "SIO" should be --SiO--.

Column 1,
Line 2, "SIO" should be --SiO--.
Line 50, "SiO2" should be --SiO$_2$--.

Column 3,
Line 41, "SIOX" should be --SiOX--.

Column 4,
Line 66, "SIOX" should be --SiOX--.

Column 5,
Line 35, "SIOX" should be --SiOX--.
Line 46, delete "10 mg of PdFAc" and insert therfore --10 mg of PdFAc/100 ml of solution--.

Column 8,
Line 57, "H$_2$TiF$_6$." should be --H$_2$TiF$_6$,--.

Column 10,
Line 58, "SIOX" should be --SiOX--.

Column 11,
Line 10, "SIOX" should be --SiOX--.

UNITED STATES PATENT AND TRADEMARK OFFICE
CERTIFICATE OF CORRECTION

PATENT NO. : 6,080,683
DATED : June 27, 2000
INVENTOR(S) : Maria Faur, et al.

It is certified that error appears in the above-identified patent and that said Letters Patent is hereby corrected as shown below:

Column 12,
Line 12 "SIOX" should be --SiOX--.

Column 13,
Line 60, "SIOX" should be --SiOX--.

Column 16,
Line 29 after "methoxylated" deleted --is--.

Claim 15,
Line 4 "$H_2SiF_6P$ n-n-butylpyridinium" should be --$H_2SiF_6$, n-n-butylpyridinium--.

Signed and Sealed this

Seventeenth Day of July, 2001

Attest:

Attesting Officer

NICHOLAS P. GODICI
Acting Director of the United States Patent and Trademark Office